United States Patent
Do et al.

(10) Patent No.: US 10,068,862 B2
(45) Date of Patent: Sep. 4, 2018

(54) SEMICONDUCTOR DEVICE AND METHOD OF FORMING A PACKAGE IN-FAN OUT PACKAGE

(71) Applicant: STATS ChipPAC, Ltd., Singapore (SG)

(72) Inventors: Byung Tai Do, Singapore (SG); Arnel Senosa Trasporto, Singapore (SG)

(73) Assignee: STATS ChipPAC Pte. Ltd., Singapore (SG)

( * ) Notice: Subject to any disclaimer, the term of this patent is extended or adjusted under 35 U.S.C. 154(b) by 214 days.

(21) Appl. No.: 15/082,190

(22) Filed: Mar. 28, 2016

(65) Prior Publication Data
US 2016/0300817 A1    Oct. 13, 2016

Related U.S. Application Data

(60) Provisional application No. 62/145,084, filed on Apr. 9, 2015.

(51) Int. Cl.
*H01L 23/48* (2006.01)
*H01L 21/60* (2006.01)
(Continued)

(52) U.S. Cl.
CPC ............ *H01L 24/11* (2013.01); *H01L 21/561* (2013.01); *H01L 23/49811* (2013.01);
(Continued)

(58) Field of Classification Search
CPC ..... H01L 25/0657; H01L 24/81; H01L 25/50; H01L 21/52
(Continued)

(56) References Cited

U.S. PATENT DOCUMENTS

| 8,476,770 | B2 * | 7/2013 | Shao ................ | B29C 43/18 257/774 |
| 2009/0140394 | A1 * | 6/2009 | Bathan ............... | H01L 21/561 257/621 |

(Continued)

*Primary Examiner* — Joseph C Nicely
*Assistant Examiner* — Thai T Vuong
(74) *Attorney, Agent, or Firm* — Brian M. Kaufman; Robert D. Atkins; Atkins and Associates, P.C.

(57) ABSTRACT

A semiconductor device comprises a first semiconductor package including a first interconnect structure extending over a surface of the first semiconductor package. The first semiconductor package includes an interposer and a second semiconductor die disposed over the interposer. A second encapsulant is deposited over the interposer and second semiconductor die. A first semiconductor die is disposed over the surface of the first semiconductor package. A second interconnect structure extends from the first semiconductor die opposite the first semiconductor package. A first encapsulant is deposited over the first semiconductor package and first semiconductor die. A portion of the first encapsulant over the first interconnect structure and second interconnect structure is removed. A discrete component is disposed on the surface of the first semiconductor package. A build-up interconnect structure is formed over the first semiconductor package and first semiconductor die. The first semiconductor package includes a molded laser package.

25 Claims, 19 Drawing Sheets

(51) Int. Cl.
    *H01L 23/538*     (2006.01)
    *H01L 21/56*     (2006.01)
    *H01L 21/50*     (2006.01)
    *H01L 23/00*     (2006.01)
    *H01L 25/00*     (2006.01)
    *H01L 25/03*     (2006.01)
    *H01L 25/10*     (2006.01)
    *H01L 23/498*     (2006.01)
    *H01L 23/31*     (2006.01)

(52) U.S. Cl.
    CPC .............. *H01L 24/19* (2013.01); *H01L 24/20* (2013.01); *H01L 25/03* (2013.01); *H01L 25/105* (2013.01); *H01L 25/50* (2013.01); *H01L 23/3128* (2013.01); *H01L 23/5383* (2013.01); *H01L 23/5389* (2013.01); *H01L 24/81* (2013.01); *H01L 24/83* (2013.01); *H01L 24/97* (2013.01); *H01L 2224/0401* (2013.01); *H01L 2224/04105* (2013.01); *H01L 2224/12105* (2013.01); *H01L 2224/16113* (2013.01); *H01L 2224/16227* (2013.01); *H01L 2224/2919* (2013.01); *H01L 2224/32225* (2013.01); *H01L 2224/73267* (2013.01); *H01L 2224/81191* (2013.01); *H01L 2224/81815* (2013.01); *H01L 2224/83005* (2013.01); *H01L 2224/83192* (2013.01); *H01L 2224/92244* (2013.01); *H01L 2224/94* (2013.01); *H01L 2224/97* (2013.01); *H01L 2225/1035* (2013.01); *H01L 2225/1058* (2013.01); *H01L 2924/15311* (2013.01); *H01L 2924/19105* (2013.01); *H01L 2924/19106* (2013.01)

(58) Field of Classification Search
    USPC .......................................................... 257/692
    See application file for complete search history.

(56)              References Cited

U.S. PATENT DOCUMENTS

| | | | |
|---|---|---|---|
| 2010/0237477 A1* | 9/2010 | Pagaila | H01L 21/561 257/660 |
| 2011/0037169 A1* | 2/2011 | Pagaila | H01L 21/561 257/737 |
| 2011/0278741 A1* | 11/2011 | Chua | H01L 21/561 257/777 |
| 2013/0341784 A1 | 12/2013 | Lin et al. | |
| 2015/0084206 A1* | 3/2015 | Lin | H01L 23/5389 257/774 |

* cited by examiner

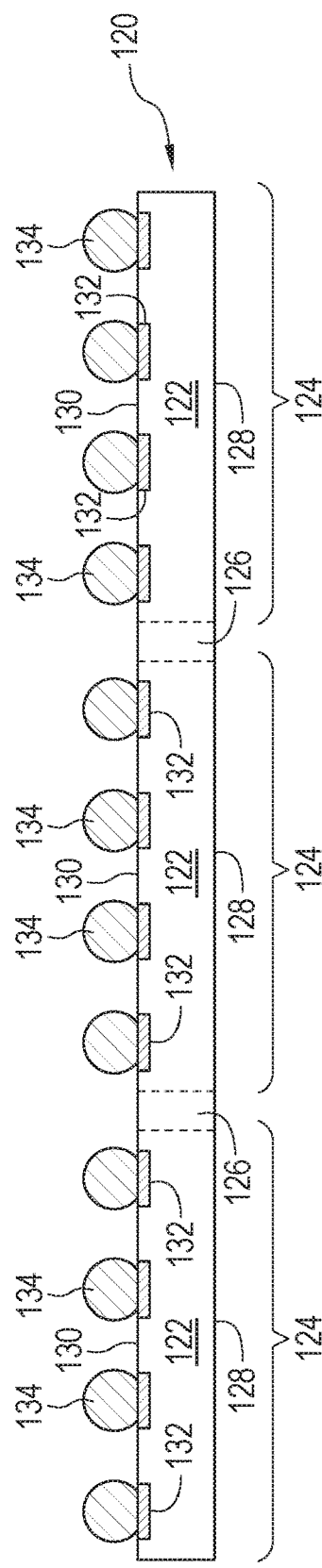
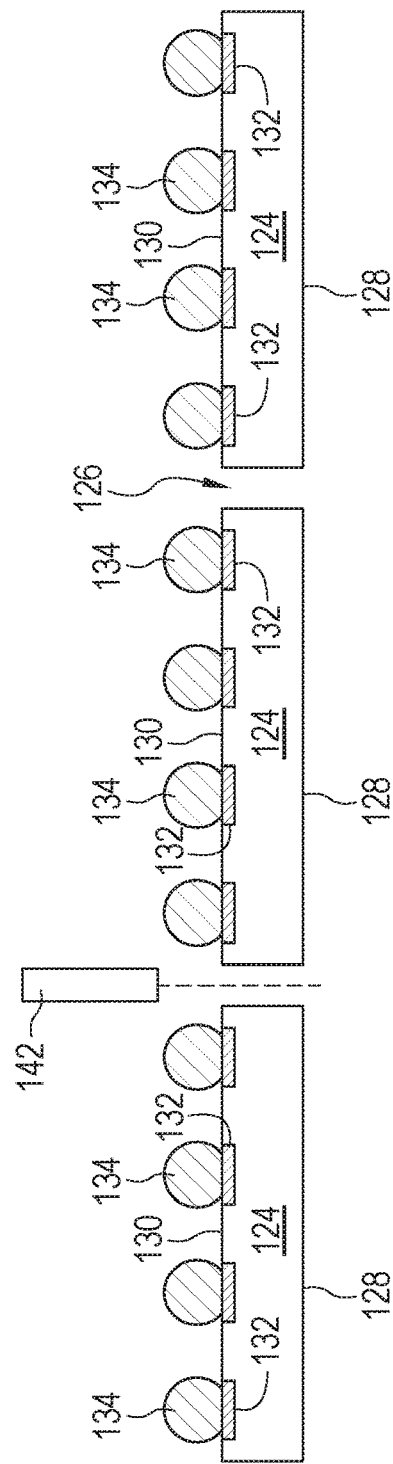
FIG. 2d
FIG. 2e

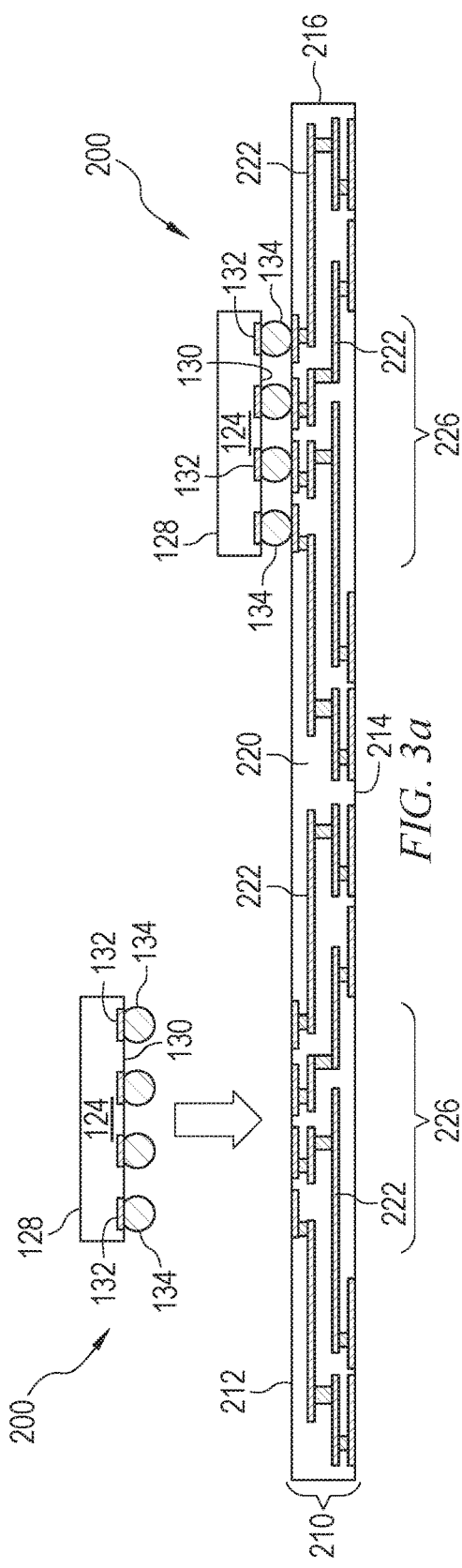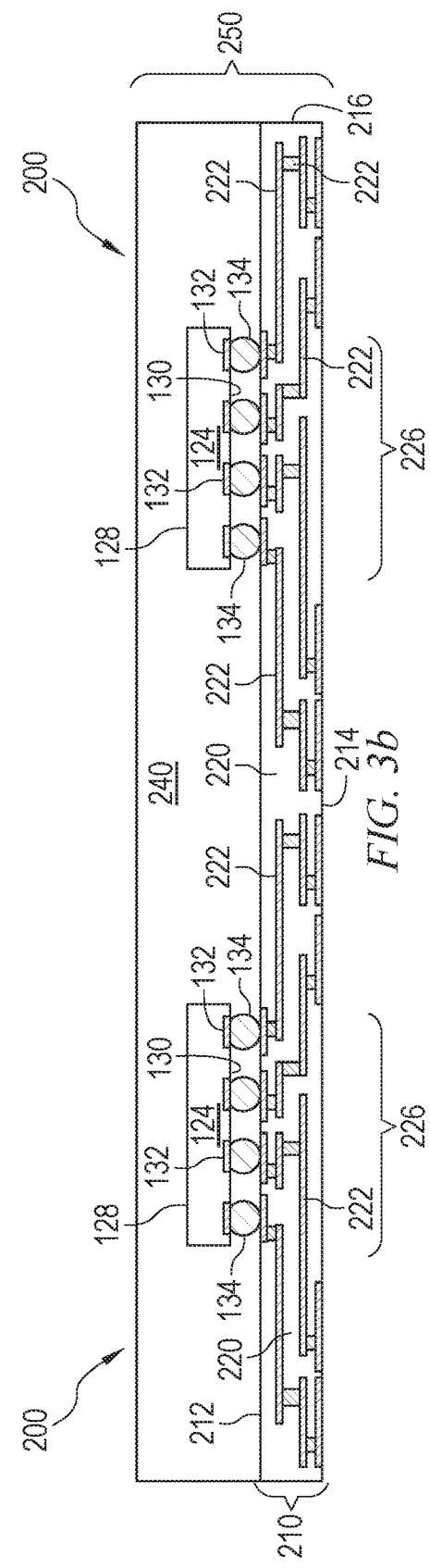

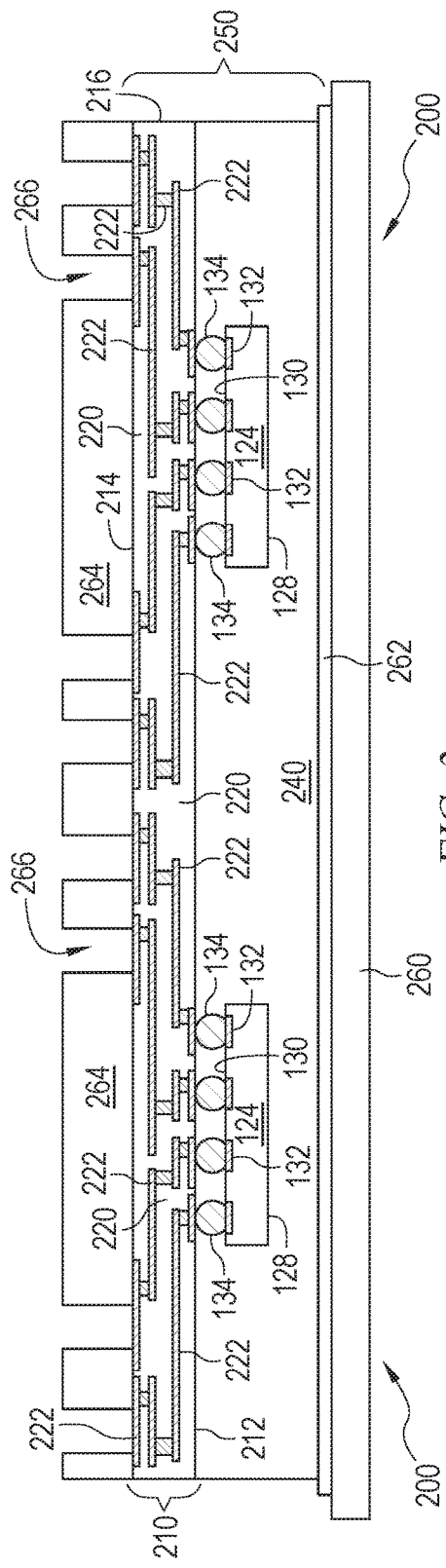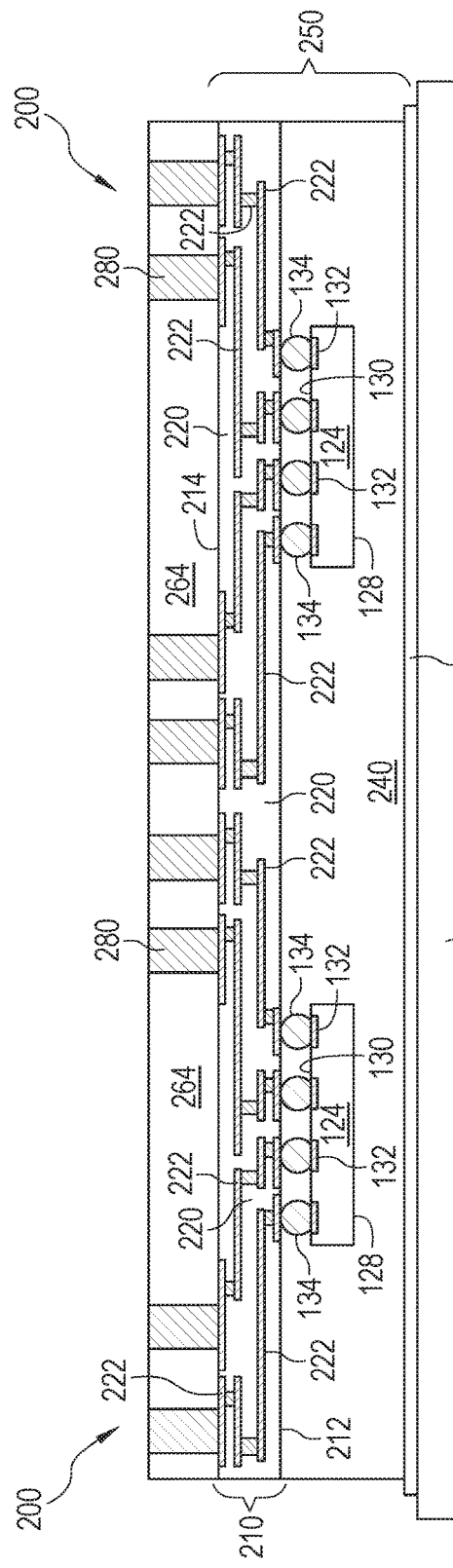

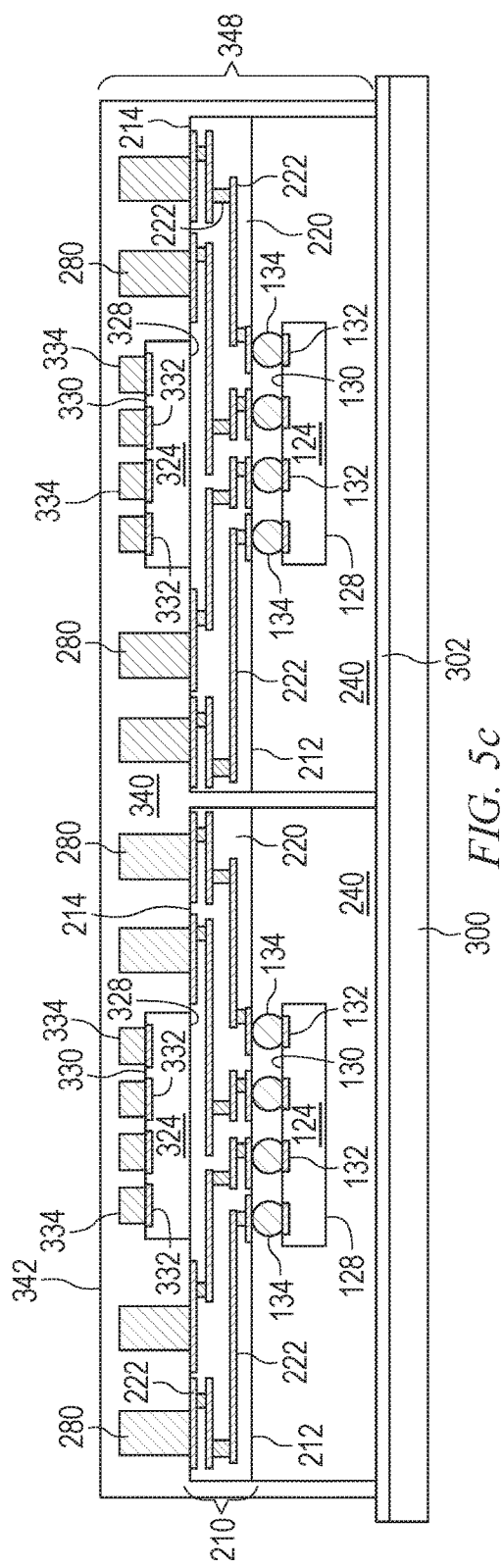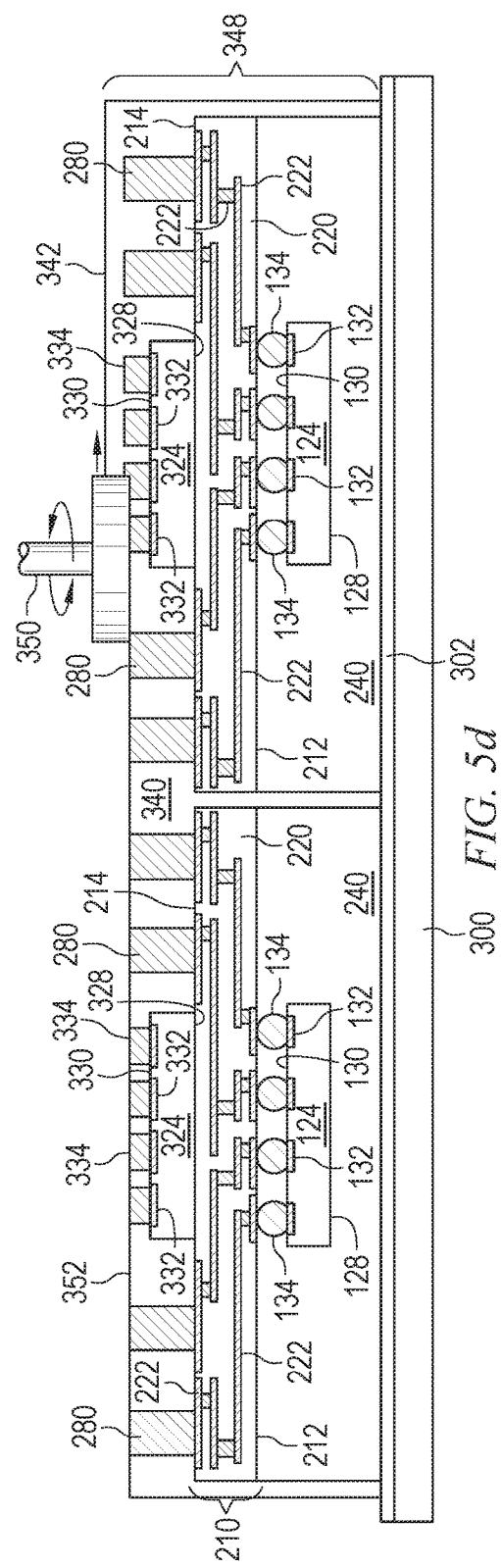

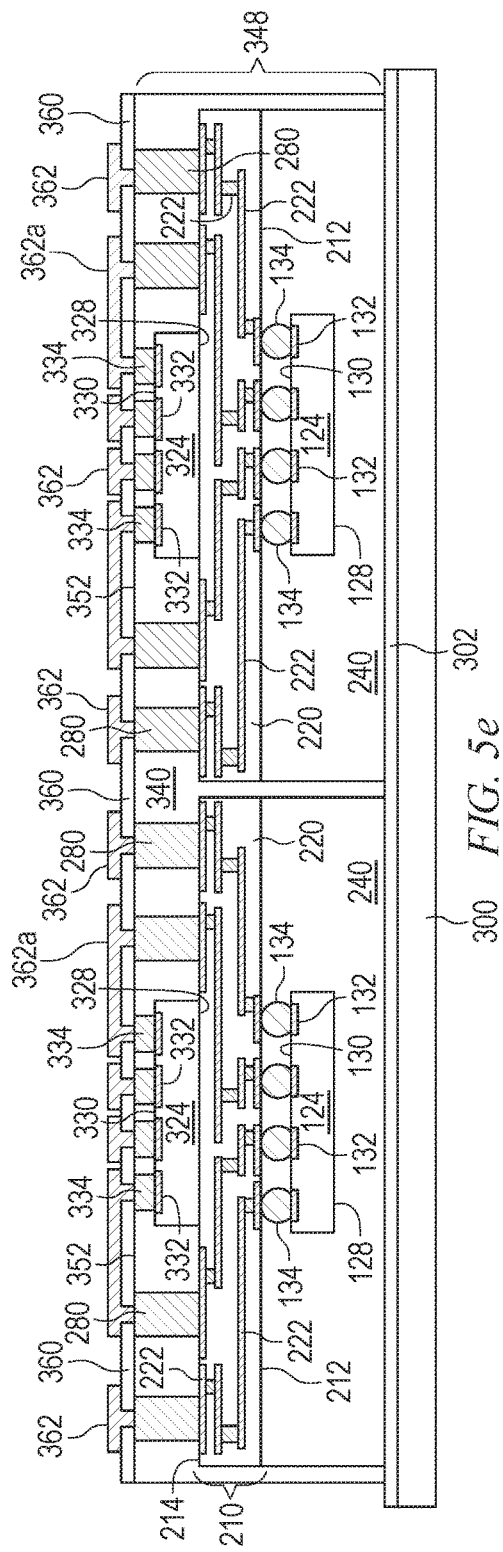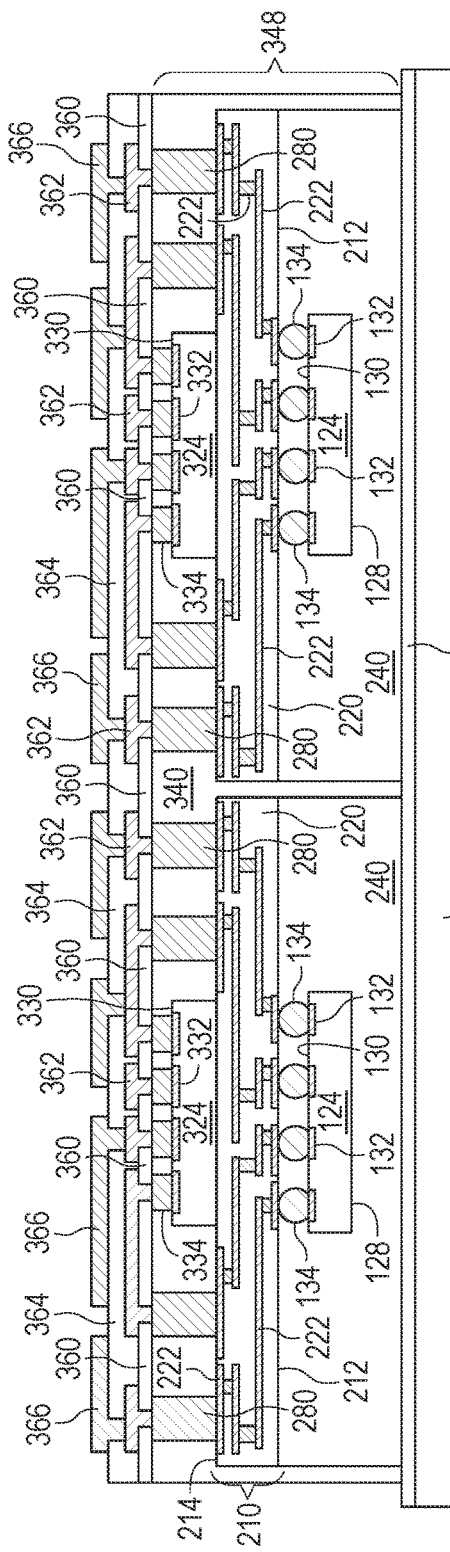

SEMICONDUCTOR DEVICE AND METHOD OF FORMING A PACKAGE IN-FAN OUT PACKAGE

CLAIM OF DOMESTIC PRIORITY

The present application claims the benefit of U.S. Provisional Application No. 62/145,084, filed Apr. 9, 2015, which application is incorporated herein by reference.

FIELD OF THE INVENTION

The present invention relates in general to semiconductor devices and, more particularly, to a semiconductor device and method of forming a package in-fan out package (PI-FOP).

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, and various signal processing circuits.

Semiconductor devices perform a wide range of functions such as signal processing, high-speed calculations, transmitting and receiving electromagnetic signals, controlling electronic devices, transforming sunlight to electricity, and creating visual images for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The structure of semiconductor material allows the material's electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed operations and other useful functions.

Semiconductor devices are generally manufactured using two complex manufacturing processes, i.e., front-end manufacturing and back-end manufacturing, each involving potentially hundreds of steps. Front-end manufacturing involves the formation of a plurality of die on the surface of a semiconductor wafer. Each semiconductor die is typically identical and contains circuits formed by electrically connecting active and passive components. Back-end manufacturing involves singulating individual semiconductor die from the finished wafer and packaging the die to provide structural support, electrical interconnect, and environmental isolation. The term "semiconductor die" as used herein refers to both the singular and plural form of the words, and accordingly, can refer to both a single semiconductor device and multiple semiconductor devices.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller semiconductor die size can be achieved by improvements in the front-end process resulting in semiconductor die with smaller, higher density active and passive components. Back-end processes may result in semiconductor device packages with a smaller footprint by improvements in electrical interconnection and packaging materials.

Another goal of semiconductor manufacturing is to produce multi-chip semiconductor packages that are smaller and cheaper to manufacture. Multi-chip packages are commonly used in mobile devices to integrate the functionality of various semiconductor die into a single system package. For instance, a memory device and an application processor chip that uses the memory device are commonly packaged together. Reducing the size of the multi-chip package, in height or width, allows reduction in the size of PCB used, and ultimately results in a smaller mobile device for the end user. Reducing the cost of producing a multi-chip semiconductor package results in a cheaper overall mobile device, which saves the consumer money.

SUMMARY OF THE INVENTION

A need exists to integrate multiple semiconductor die in a single package with reduced size and manufacturing cost. Accordingly, in one embodiment, the present invention is a method of making a semiconductor device comprising the steps of providing a semiconductor package including a first interconnect structure extending over a surface of the first semiconductor package, disposing a first semiconductor die over the surface of the first semiconductor package including a second interconnect structure extending from the first semiconductor die opposite the first semiconductor package, depositing a first encapsulant over the first semiconductor package and first semiconductor die, and removing a portion of the first encapsulant over the first interconnect structure and second interconnect structure In another embodiment, the present invention is a method of making a semiconductor device comprising the steps of providing a semiconductor package including a first interconnect structure, providing a first semiconductor die including a second interconnect structure, disposing the first semiconductor die over the first semiconductor package, depositing an encapsulant over the first semiconductor package and first semiconductor die, and forming a third interconnect structure over the first semiconductor package, first semiconductor die, and first encapsulant.

In another embodiment, the present invention is a semiconductor device comprising a first semiconductor package. A first interconnect structure is disposed over a surface of the first semiconductor package. A first semiconductor die is disposed over the surface of the first semiconductor package. A second interconnect structure is disposed over the first semiconductor die. An encapsulant is deposited over the first semiconductor package and first semiconductor die.

In another embodiment, the present invention is a semiconductor device comprising a first semiconductor package. A first semiconductor die is disposed on the first semiconductor package. An encapsulant is deposited over the first semiconductor package and first semiconductor die. An interconnect structure is disposed over the first semiconductor package, first semiconductor die, and encapsulant.

BRIEF DESCRIPTION OF THE DRAWINGS

FIGS. 2a-2e illustrate a semiconductor wafer with a plurality of semiconductor die separated by a saw street;

FIGS. 3a-3e illustrate a method of forming a fan-out semiconductor package;

FIGS. 5a-5h illustrate a method of forming a PI-FOP device with the fan-out semiconductor package as a base;

DETAILED DESCRIPTION OF THE DRAWINGS

Figure 1:
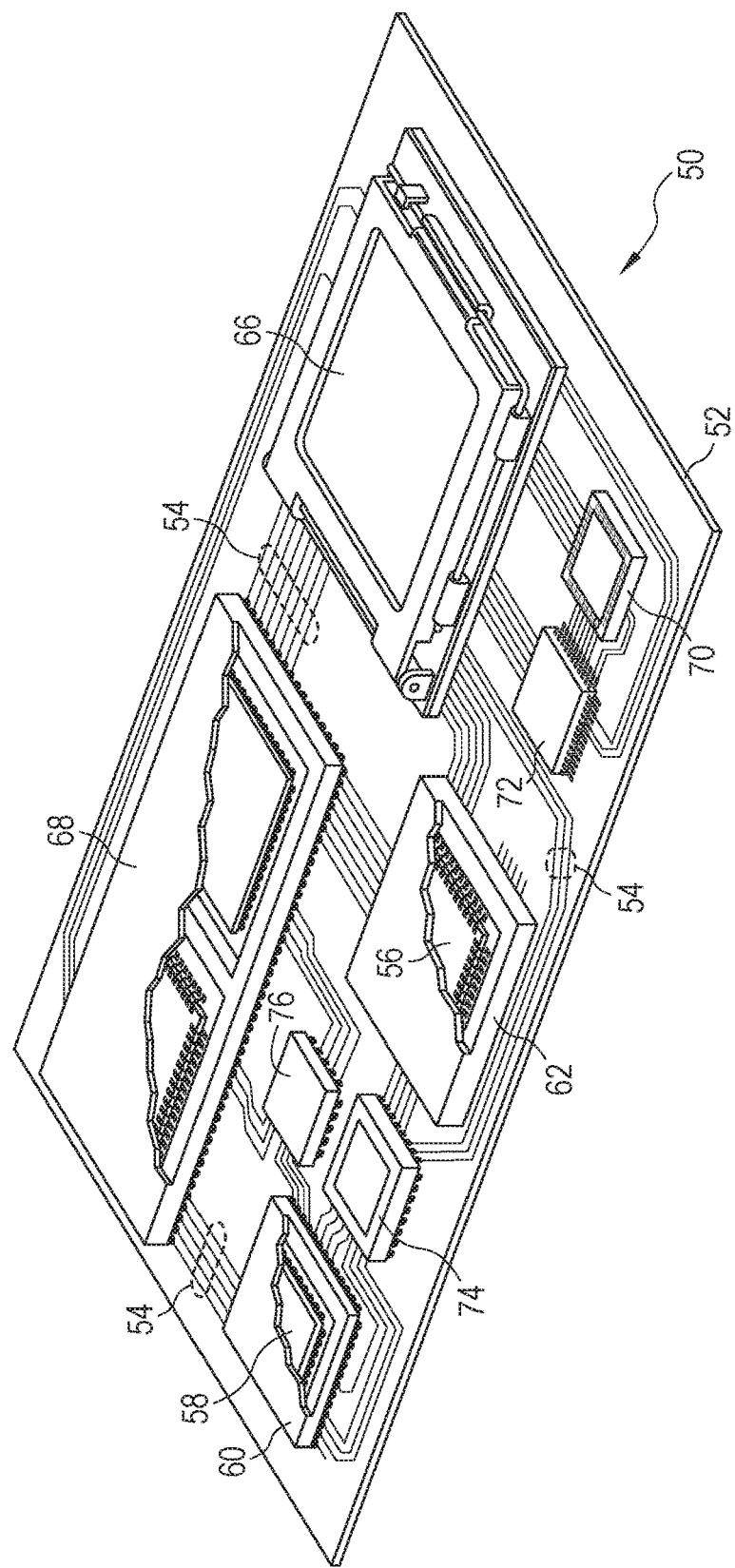
FIG. 1 illustrates a printed circuit board (PCB) with different types of packages mounted to a surface of the PCB.

The present invention is described in one or more embodiments in the following description with reference to the figures, in which like numerals represent the same or similar elements. While the invention is described in terms of the best mode for achieving objectives of the invention, those skilled in the art will appreciate that the disclosure is intended to cover alternatives, modifications, and equivalents as may be included within the spirit and scope of the invention as defined by the appended claims and claims equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, and resistors, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices by dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition can involve chemical vapor deposition (CVD), physical vapor deposition (PVD), electrolytic plating, and electroless plating processes. Each layer is generally patterned to form portions of active components, passive components, or electrical connections between components.

Back-end manufacturing refers to cutting or singulating the finished wafer into the individual semiconductor die and packaging the semiconductor die for structural support, electrical interconnect, and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with conductive layers, bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 50 having a chip carrier substrate or PCB 52 with a plurality of semiconductor packages mounted on a surface of PCB 52. Electronic device 50 can have one type of semiconductor package, or multiple types of semiconductor packages, depending on the application. The different types of semiconductor packages are shown in FIG. 1 for purposes of illustration.

Electronic device 50 can be a stand-alone system that uses the semiconductor packages to perform one or more electrical functions. Alternatively, electronic device 50 can be a subcomponent of a larger system. For example, electronic device 50 can be part of a tablet, cellular phone, digital camera, or other electronic device. Alternatively, electronic device 50 can be a graphics card, network interface card, or other signal processing card that can be inserted into a computer. The semiconductor package can include microprocessors, memories, application specific integrated circuits (ASIC), microelectromechanical systems (MEMS), logic circuits, analog circuits, RF circuits, discrete devices, or other semiconductor die or electrical components. Miniaturization and weight reduction are essential for the products to be accepted by the market. The distance between semiconductor devices may be decreased to achieve higher density.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate substrate. Second level packaging involves mechanically and electrically attaching the intermediate substrate to the PCB. In other embodiments, a semiconductor device may only have the first level packaging where the die is mechanically and electrically mounted directly to the PCB.

For the purpose of illustration, several types of first level packaging, including bond wire package 56 and flipchip 58, are shown on PCB 52. Additionally, several types of second level packaging, including ball grid array (BGA) 60, bump chip carrier (BCC) 62, land grid array (LGA) 66, multi-chip module (MCM) 68, quad flat non-leaded package (QFN) 70, quad flat package 72, embedded wafer level ball grid array (eWLB) 74, and wafer level chip scale package (WLCSP) 76 are shown mounted on PCB 52. In one embodiment, eWLB 74 is a fan-out wafer level package (Fo-WLP) and WLCSP 76 is a fan-in wafer level package (Fi-WLP). Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

Figure 2A:
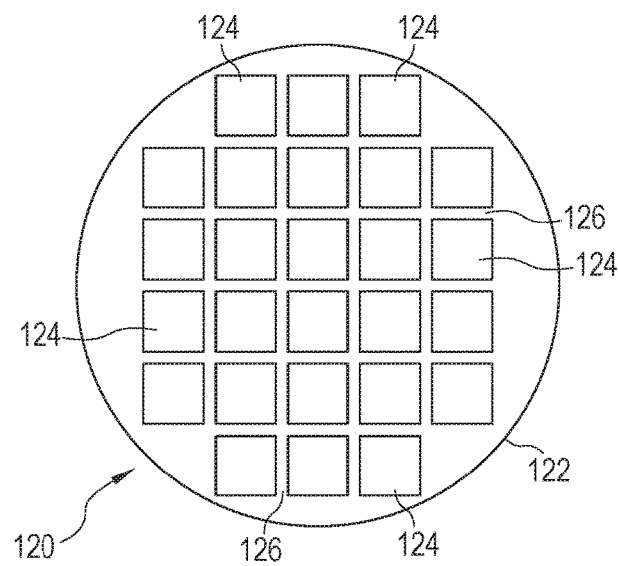

FIG. 2a shows a semiconductor wafer 120 with a base substrate material 122, such as silicon, germanium, aluminum phosphide, aluminum arsenide, gallium arsenide, gallium nitride, indium phosphide, silicon carbide, or other bulk semiconductor material for structural support. A plurality of semiconductor die or components 124 is formed on wafer 120 separated by a non-active, inter-die wafer area or saw street 126 as described above. Saw street 126 provides cutting areas to singulate semiconductor wafer 120 into individual semiconductor die 124. In one embodiment, semiconductor wafer 120 has a width or diameter of 100-450 millimeters (mm).

Figure 2B:
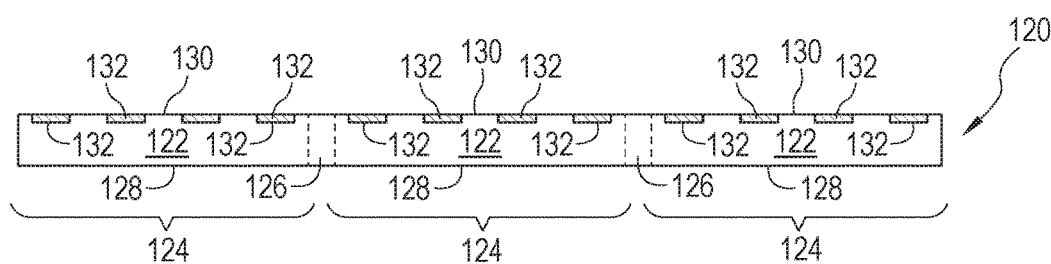

FIG. 2b shows a cross-sectional view of a portion of semiconductor wafer 120. Each semiconductor die 124 has a back or non-active surface 128 and an active surface 130 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 130 to implement analog circuits or digital circuits, such as digital signal processor (DSP), ASIC, MEMS, memory, or other signal processing circuit. Semiconductor die 124 may also contain integrated passive devices (IPDs), such as inductors, capacitors, and resistors, for RF signal processing. Back surface 128 of semiconductor wafer 120 may undergo an optional backgrinding operation with a mechanical grinding or etching process to remove a portion of base material 122 and reduce the thickness of semiconductor wafer 120 and semiconductor die 124.

An electrically conductive layer 132 is formed over active surface 130 using PVD, CVD, electrolytic plating, electroless plating process, or other suitable metal deposition process. Conductive layers 132 includes one or more layers of aluminum (Al), copper (Cu), tin (Sn), nickel (Ni), gold (Au), silver (Ag), or other suitable electrically conductive material. Conductive layer 132 operates as contact pads electrically connected to the circuits on active surface 130. Conductive layer 132 can be formed as contact pads disposed side-by-side a first distance from the edge of semiconductor die 124, as shown in FIG. 2b. Alternatively, conductive layer 132 can be formed as contact pads that are offset in multiple rows such that a first row of contact pads is disposed a first distance from the edge of the die, and a second row of contact pads alternating with the first row disposed a second distance from the edge of the die.

Semiconductor wafer 120 undergoes electrical testing and inspection as part of a quality control process. Manual visual inspection and automated optical systems are used to perform inspections on semiconductor wafer 120. Software can be used in the automated optical analysis of semiconductor wafer 120. Visual inspection methods may employ equipment such as a scanning electron microscope, high-intensity or ultra-violet light, or metallurgical microscope. Semiconductor wafer 120 is inspected for structural characteristics including warpage, thickness variation, surface particulates, irregularities, cracks, delamination, and discoloration.

Figure 2C:
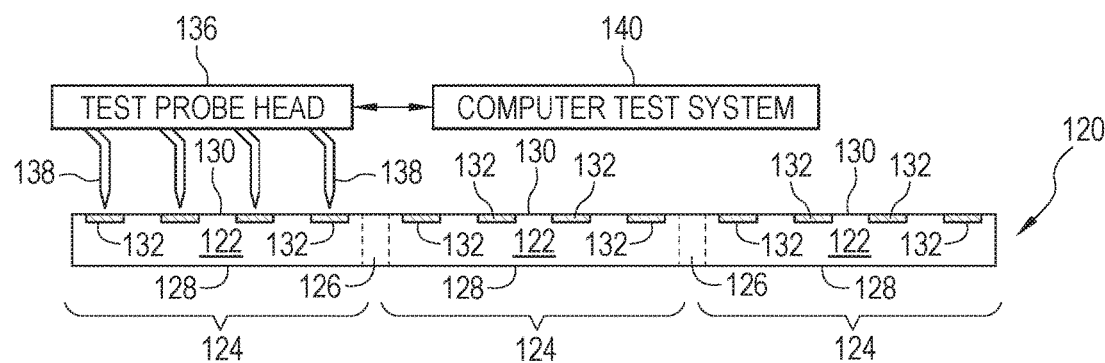

The active and passive components within semiconductor die 124 undergo testing at the wafer level for electrical performance and circuit function. Each semiconductor die 124 is tested for functionality and electrical parameters, as shown in FIG. 2c, using a test probe head 136 including a plurality of probes or test leads 138, or other testing device. Probes 138 are used to make electrical contact with nodes or conductive layer 132 on each semiconductor die 124 and provide electrical stimuli to contact pads 132. Semiconductor die 124 responds to the electrical stimuli, which is measured by computer test system 140 and compared to an expected response to test functionality of the semiconductor die. The electrical tests may include circuit functionality, lead integrity, resistivity, continuity, reliability, junction depth, ESD, RF performance, drive current, threshold current, leakage current, and operational parameters specific to the component type. The inspection and electrical testing of semiconductor wafer 120 enables semiconductor die 124 that pass to be designated as known good die (KGD) for use in a semiconductor package.

In FIG. 2d, an electrically conductive bump material is deposited over contact pads 132 using an evaporation, electrolytic plating, electroless plating, ball drop, or screen printing process. The bump material can be Al, Sn, Ni, Au, Ag, lead (Pb), bismuth (Bi), Cu, solder, and combinations thereof, with an optional flux solution. For example, the bump material can be eutectic Sn/Pb, high-lead solder, or lead-free solder. The bump material is bonded to contact pads 132 using a suitable attachment or bonding process. In one embodiment, the bump material is reflowed by heating the material above its melting point to form balls or bumps 134. In some applications, bumps 134 are reflowed a second time to improve electrical coupling to contact pads 132. Bumps 134 can also be compression bonded or thermocompression bonded to contact pads 132. Bumps 134 represent one type of interconnect structure that can be formed over contact pads 132. The interconnect structure can also use stud bump, micro bump, or other electrical interconnect.

In FIG. 2e, semiconductor wafer 120 is singulated through saw street 126 using a saw blade or laser cutting tool 142 into individual semiconductor die 124. The individual semiconductor die 124 can be inspected and electrically tested for identification of KGD post-singulation.

Figure 3E:
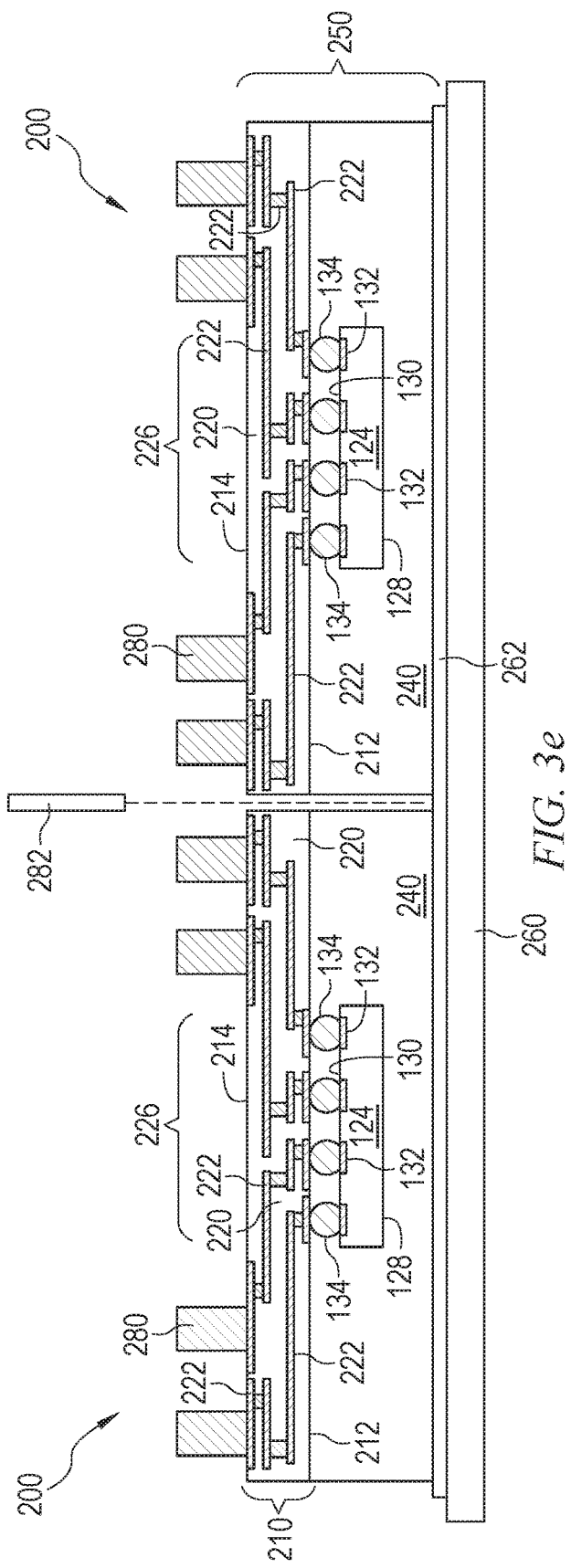

FIGS. 3a-3e illustrate, in relation to FIGS. 1 and 2a-2e, formation of a plurality of fan-out semiconductor packages 200, including semiconductor die 124, on substrate or interposer 210. FIG. 3a shows interposer 210 including surface 212, surface 214 opposite surface 212, and edges 216. Interposer 210 can be a laminate interposer, PCB, waferform, or strip interposer. Interposer 210 includes one or more insulating or passivation layers 220 and one or more conductive layers 222. Interposer 210 may include one or more laminated layers of polytetrafluoroethylene pre-impregnated (prepreg), FR-4, FR-1, CEM-1, or CEM-3 with a combination of phenolic cotton paper, epoxy, resin, woven glass, matte glass, polyester, and other reinforcement fibers or fabrics. Insulating layers 220 may contain one or more layers of silicon dioxide (SiO2), silicon nitride (Si3N4), silicon oxynitride (SiON), tantalum pentoxide (Ta2O5), aluminum oxide (Al2O3), or other material having similar insulating and structural properties. Interposer 210 can also be a multi-layer flexible laminate, ceramic, copper foil, glass, or semiconductor wafer including an active surface containing one or more transistors, diodes, and other circuit elements to implement analog circuits or digital circuits.

Interposer 210 includes one or more electrically conductive layers or redistribution layers (RDL) 222 formed using sputtering, electrolytic plating, electroless plating, or other suitable deposition process. Conductive layers 222 can be one or more layers of Al, Cu, Sn, Ni, Au, Ag, titanium (Ti), tungsten (W), or other suitable electrically conductive material. Conductive layers 222 include lateral RDL layers and vertical conductive vias to provide vertical and horizontal conduction paths through interposer 210. Portions of conductive layers 222 are electrically common or electrically isolated according to the design and function of semiconductor die 124 to be mounted to the particular interposer 210.

Semiconductor die 124 from FIG. 2d are mounted to interposer 210 using, for example, a pick and place operation with active surface 130 of semiconductor die 124 oriented toward the interposer. The circuits on active surface 130 of semiconductor die 124 are electrically connected through conductive layer 132 and bumps 134 to conductive layers 222 of interposer 210. Bumps 134 are reflowed to metallurgically bond and electrically connect semiconductor die 124 to contact pads formed by conductive layers 222 on surface 212 of interposer 210. Conductive layers 222 are structured to provide a fan-out pattern from surface 212 to surface 214. Conductive layers 222 form contact pads on surface 214 of interposer 210 that are spread out further than contact pads on surface 212. In one embodiment, the fan-out of conductive layers 222 leaves the area of surface 214 directly over, or within a footprint of, semiconductor die 124 free of contact pads as a die attach area 226 for subsequently provided semiconductor die.

In FIG. 3b, an encapsulant or molding compound 240 is deposited over semiconductor die 124 and surface 212 of interposer 210 as an insulating material using a paste printing, compressive molding, transfer molding, liquid encapsulant molding, vacuum lamination, spin coating, or other suitable applicator. In particular, encapsulant 240 covers the side surfaces, active surface 130, and surface 128 of semiconductor die 124, as well as bumps 134 and surface 212. Encapsulant 240 is deposited over and around semiconductor die 124. Encapsulant 240 can be polymer composite material, such as epoxy resin with filler, epoxy acrylate with filler, or polymer with proper filler. Encapsulant 240 is non-conductive and environmentally protects the semiconductor device from external elements and contaminants. Encapsulant 240 also protects semiconductor die 124 from degradation due to exposure to light.

In other embodiments, encapsulant 240 is deposited over semiconductor die 124 and a sacrificial carrier. The carrier is removed by chemical etching, mechanical peel-off, chemical-mechanical polishing (CMP), mechanical grinding, thermal bake, laser scanning, or wet stripping to expose bumps 134, or conductive layer 132 if bumps 134 are not used. Interposer 210 is formed over encapsulant 240 and semiconductor die 124 as a build-up interconnect structure by successively depositing and patterning insulating layers 220 and conductive layers 222.

Encapsulant 240, semiconductor die 124, and interposer 210 in FIG. 3b form a reconstituted wafer or panel 250 that is flipped and disposed over a carrier or temporary substrate 260 in FIG. 3c. Carrier 260 contains sacrificial base material such as silicon, polymer, beryllium oxide, glass, or other suitable low-cost, rigid material for structural support. Carrier 260 is formed from an organic or inorganic material and used for process handling. An interface layer or double-sided tape 262 is formed over carrier 260 as a temporary adhesive bonding film, etch-stop layer, or thermal release layer. Panel 250 is disposed on carrier 260 with encapsulant 240 contacting interface layer 262 or carrier 260. Active surface 130 of semiconductor die 124 is oriented away from carrier 260.

A patterning or photoresist layer 264 is formed over surface 214 of interposer 210 using printing, spin coating, or spray coating. In some embodiments, photoresist layer 264 is an insulating layer including one or more layers of SiO2, Si3N4, SiON, Ta2O5, Al2O3, or other material having similar structural properties. A portion of photoresist layer 264 is exposed and removed by an etching process to form openings or vias 266 that extend down to and expose contact pads formed by conductive layer 222 on surface 214 of interposer 210. Alternatively, openings 152 are formed by laser direct ablation (LDA).

In FIG. 3d, an electrically conductive material is deposited into openings 266 over conductive layer 222 using a patterning and metal deposition process such as evaporation, screen printing, sputtering, electrolytic plating, or electroless plating to form conductive pillars or pillars 280. The conductive material deposited in openings 266 to form conductive pillars 280 can be one or more layers of Al, Cu, Sn, Ti, Ni, Au, Ag, W, or other suitable electrically conductive material. In one embodiment, the conductive material is deposited by Cu plating into openings 266 of photoresist layer 264. Conductive pillars 280 are formed on, and electrically connected to, conductive layer 222. In some embodiments, a seed layer is used between conductive layer 222 and conductive pillars 280.

In FIG. 3e, remaining portions of photoresist layer 264 are removed by a chemical stripping or etching process to leave conductive pillars 280 and to expose die attach area 226 of interposer 210. Conductive pillars 280 can have a cylindrical shape with a circular or oval cross-section, or conductive pillars 280 can have a cubic shape with a rectangular cross-section. Other shapes of conductive pillars 280 are used in other embodiments. In some embodiments, an electrically conductive pre-solder or bump material is deposited over the exposed conductive pillars 280 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder.

Panel 250 with conductive pillars 280 is singulated through insulating layers 220 and encapsulant 240 using a saw blade or laser cutting tool 282 into individual fan-out packages 200. The individual fan-out packages 200 are removed from carrier 260 and can be inspected and electrically tested.

Figure 4A:
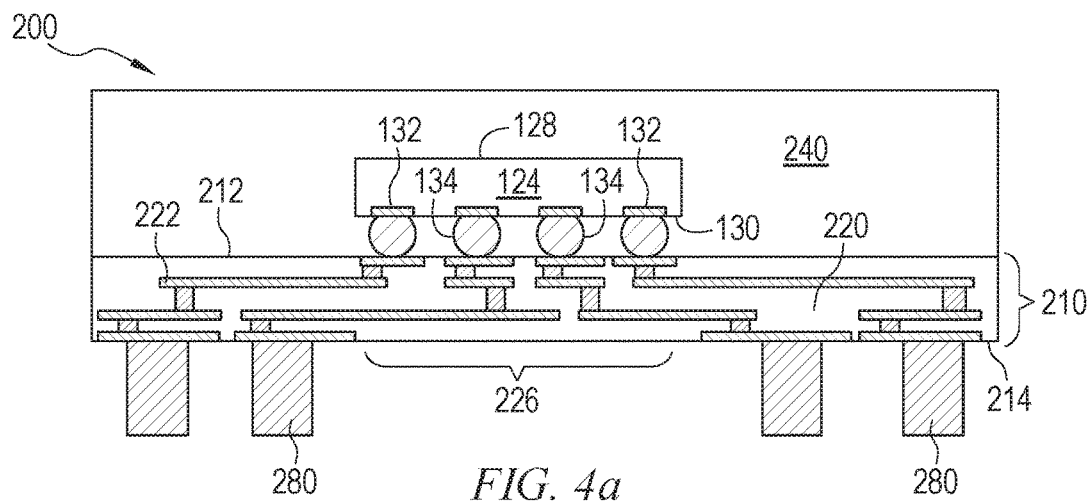
FIGS. 4a-4c illustrate fan-out semiconductor packages used to make a package in-fan out package (PI-FOP)

FIG. 4a illustrates a single fan-out package 200 after singulation and removal from carrier 260. Semiconductor die 124 is disposed over interposer 210. Encapsulant 240 covers semiconductor die 124 and interposer 210 for environmental protection. Interposer 210 provides a fan-out from contact pads on surface 212, which are closer together, to contact pads on surface 214, which are further apart to provide die attach area 226 over interposer 210 opposite semiconductor die 124. Conductive pillars 280 extend over surface 214 opposite semiconductor die 124 around die attach area 226.

Figure 4B:
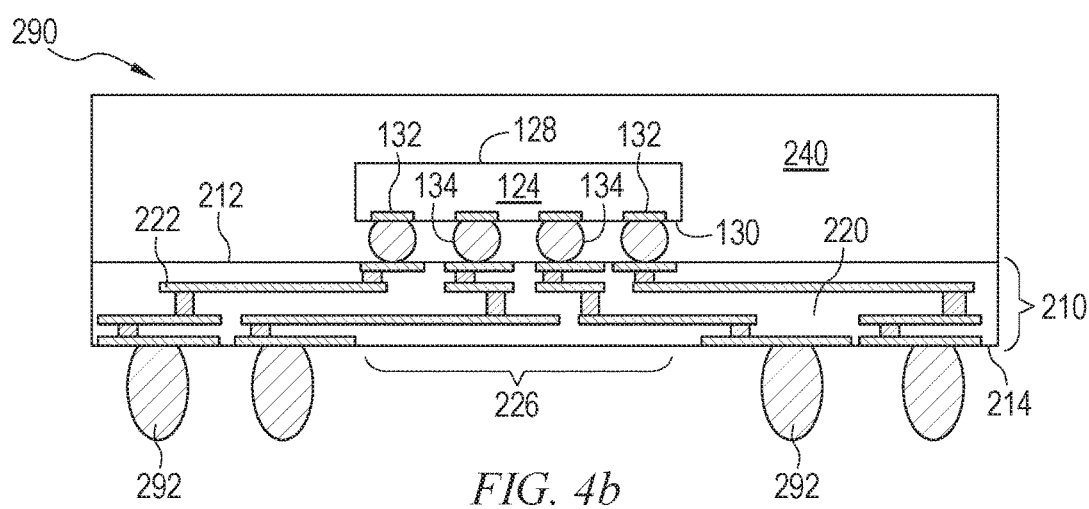

FIG. 4b illustrates a single fan-out package 290 manufactured in a similar manner to the process illustrated in FIGS. 3a-3e. Fan-out package 290 is similar to fan-out package 200, but replaces conductive pillars 280 with conductive bumps or solder balls 292. An electrically conductive bump material is deposited over portions of conductive layer 222 exposed at surface 214 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 222 using a suitable attachment or bonding process. In one embodiment, the bump material is reflowed by heating the material above its melting point to form spherical balls or bumps 292. In some applications, bumps 292 are reflowed a second time to improve electrical contact to conductive layer 222. In one embodiment, bumps 292 are formed over an under bump metallization (UBM) having a wetting layer, barrier layer, and adhesion layer. Bumps 292 can also be compression bonded or thermocompression bonded to conductive layer 222. Solder balls 292 extend over surface 214 around die attach area 226.

Figure 4C:
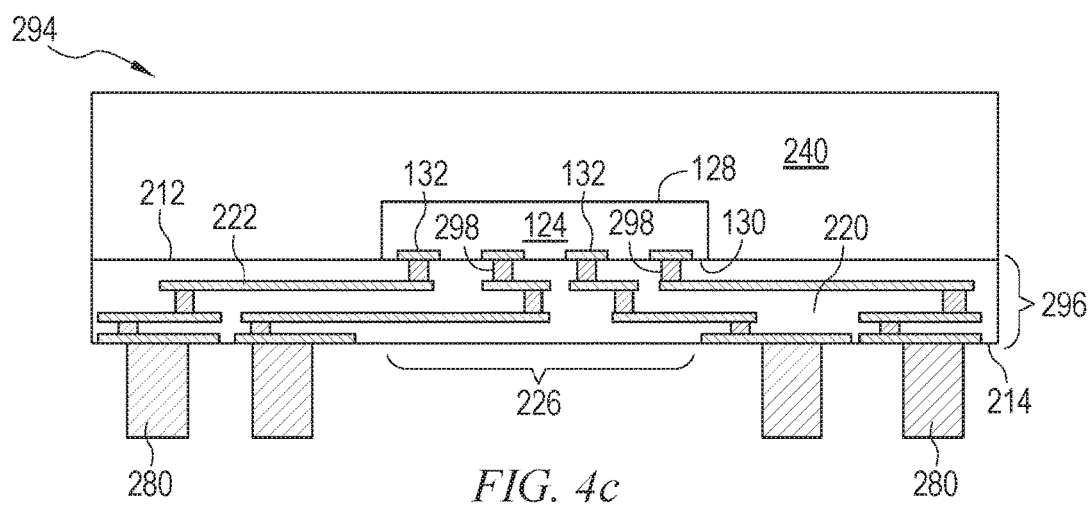

FIG. 4c illustrates a single fan-out package 294 manufactured in a similar manner to the process illustrated in FIGS. 3a-3e. Fan-out package 294 is similar to fan-out package 200, but bumps 134 are not used. A plurality of semiconductor die 124 is disposed on a carrier with active surface 130 oriented toward the carrier. Encapsulant 240 is disposed over the carrier and semiconductor die 124 to form a reconstituted wafer. Build-up interconnect structure 296 is formed over semiconductor die 124 after encapsulation as a build-up interconnect structure rather than as a prefabricated interposer. A portion of conductive layer 222 is deposited through a first insulating layer 220 to form conductive vias 298 contacting conductive layer 132 of semiconductor die 124. Additional insulating layers 220 and conductive layers 222 are successively formed and patterned over encapsulant 240 and semiconductor die 124 to form build-up interconnect structure 296 with a similar connectivity pattern to interposer 210. Build-up interconnect structure 296 fans-out to conductive pillars 280. Conductive pillars 280 extend over surface 214 of build-up interconnect structure 296. Die attach area 226 remains free of conductive pillars 280. Fan-out package 294 is compatible with bumps 292 as well as pillars 280.

Figure 5A:
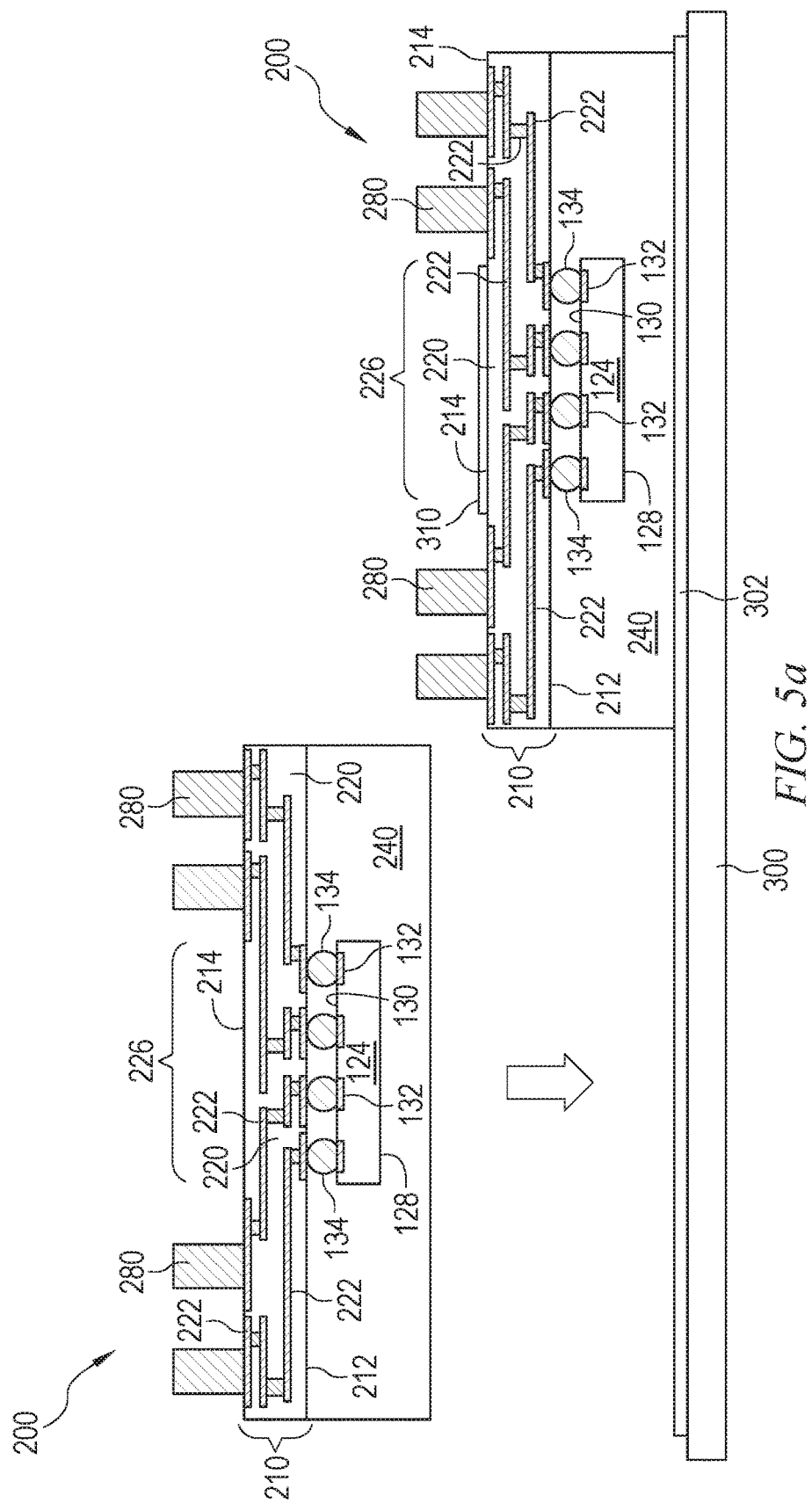

FIGS. 5a-5h illustrate formation of package in-fan out packages (PI-FOP) using fan-out packages 200 as a base. In other embodiments, the process steps illustrated in FIGS. 5a-5h are performed using fan-out packages 290 or 294 as a base to form a PI-FOP. In FIG. 5a, a plurality of fan-out packages 200 from FIG. 4a is disposed over carrier or temporary substrate 300 containing sacrificial base material such as silicon, polymer, beryllium oxide, glass, or other suitable low-cost, rigid material for structural support. Carrier 300 is formed from an organic or inorganic material and used for process handling. In some embodiments, an interface layer or double-sided tape 302 is formed over carrier 300 as a temporary adhesive bonding film, etch-stop layer, or thermal release layer.

Carrier 300 can be a round or rectangular panel with capacity for multiple fan-out packages 200. Carrier 300 may have any arbitrary surface area that is convenient for processing fan-out packages 200 and manufacturing PI-FOP devices. A larger carrier 300 reduces the manufacturing cost per PI-FOP as more packages can be processed on the larger carrier thereby reducing the cost per unit. Semiconductor packaging and processing equipment are designed and configured for the size of the wafer or carrier being processed.

To further reduce manufacturing costs, the size of carrier 300 is selected independent of the size of fan-out packages 200 or semiconductor wafer 120. That is, carrier 300 has a fixed or standardized size, which can accommodate various sizes of fan-out packages 200. In one embodiment, carrier 300 is circular with a diameter of 330 mm. In another embodiment, carrier 300 is rectangular with a width of 560 mm and length of 600 mm. Fan-out packages 200 may have dimensions of 20 mm by 20 mm, which are placed on the standardized carrier 300. Alternatively, fan-out packages 200 may have dimensions of 50 mm by 50 mm, which are placed on the same standardized carrier 300. Accordingly, standardized carrier 300 can handle any size fan-out packages 200, which allows subsequent semiconductor processing equipment to be standardized to a common carrier 300, i.e., without regard for incoming package size or output PI-FOP size. Semiconductor packaging equipment can be designed and configured for a standard carrier using a common set of processing tools, equipment, and bill of materials to process any semiconductor die or package size from any incoming wafer size. The common or standardized carrier 300 lowers manufacturing costs and capital risk by reducing or eliminating the need for specialized semiconductor processing lines based on die size or incoming wafer size. By selecting a predetermined carrier size to use for any size fan-out package, a flexible manufacturing line can be implemented.

Each fan-out package 200 to be processed on carrier 300 is laid side-by-side in a dead bug position. Encapsulant 240 of each fan-out package 200 contacts interface layer 302 or carrier 300. Conductive pillars 280 extend upward from interposer 210 over carrier 300, similar to the legs of a dead bug. Conductive pillars 280 surround die attach area 226. Die attach area 226 is exposed on top of each fan-out package 290. Die attach area 226 provides a substantially flat and even surface on each fan-out package 200 for placement of a secondary semiconductor die.

In some embodiments, a die attach adhesive 310 is deposited over die attach area 226 before or after fan-out packages 200 are disposed on carrier 300. Adhesive 310 can include epoxy resin, thermoplastic resin, acrylate monomer, a hardening accelerator, organic filler, silica filler, or polymer filler. Adhesive 310 is an adhesive film or paste in one embodiment. Adhesive 310 facilitates and strengthens the attachment of secondary semiconductor die to die attach area 226.

Figure 5B:
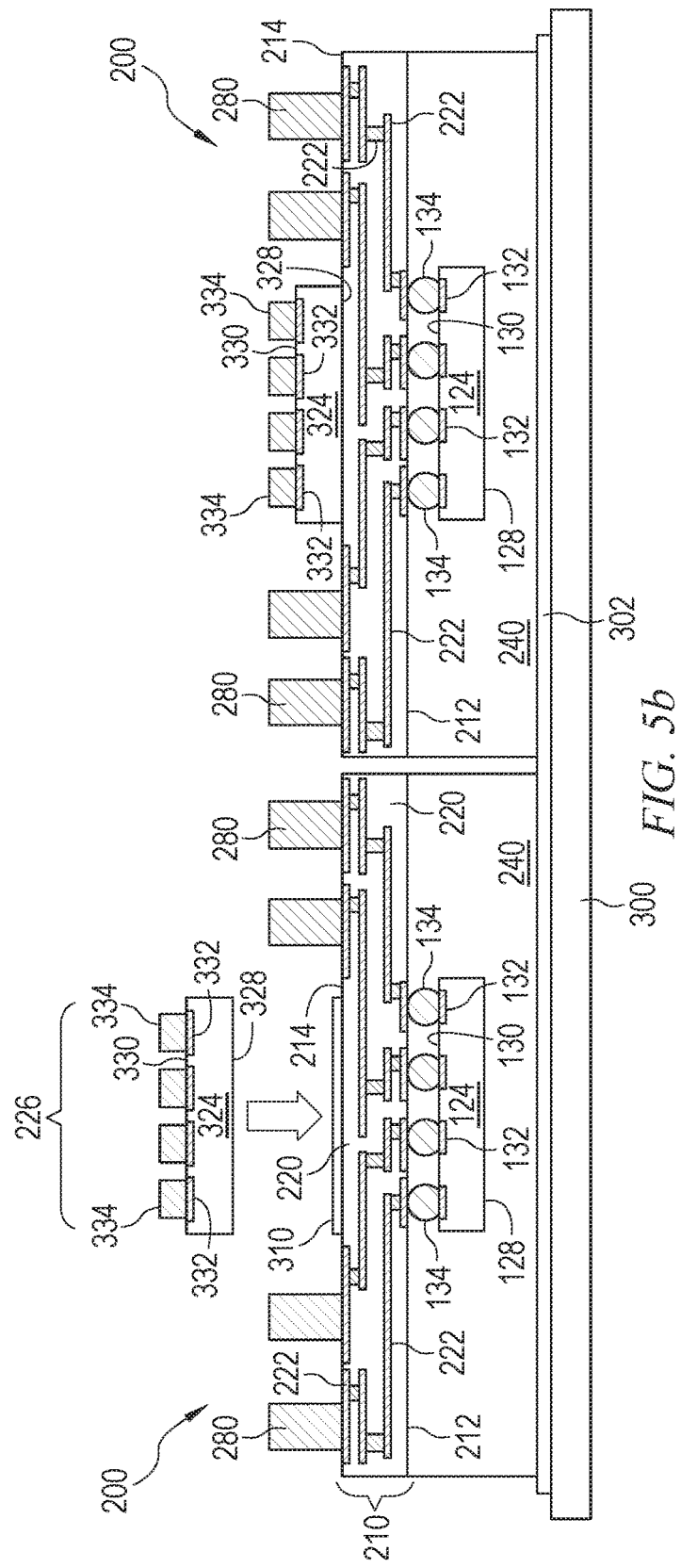

FIG. 5b illustrates secondary semiconductor die 324 disposed over and mounted to fan-out packages 200 at die attach area 226. Semiconductor die 324 are formed in a similar manner to semiconductor die 124, and include conductive layer 332 as contact pads on active surface 330. Semiconductor die 324 generally performs a function that is complementary to semiconductor die 124. In one embodiment, semiconductor die 124 is a central processing unit (CPU) or other application processor, and semiconductor die 324 is a random access memory (RAM) or flash memory chip used by semiconductor die 124 to store data. In another embodiment, semiconductor die 124 is a CPU and semiconductor die 324 is a graphical processing unit (GPU). Semiconductor die 124 and 324 are packaged together so that the functionality of each is available to a larger system formed on, e.g., electronic device 50, by incorporating a single semiconductor package.

In some embodiments, semiconductor die 324 undergo a backgrinding operation prior to singulation to include a thickness less than a height of conductive pillars 280. With semiconductor die 324 disposed on die attach area 226, back surface 328 rests on, and is approximately parallel with, surface 214 of interposer 210. Active surface 330 of semiconductor die 324 is within a height of conductive pillars 280.

Conductive pillars 334 are similar to conductive pillars 280, and are formed on contact pad portions of conductive layer 332 as vertical interconnect structures. Conductive pillars 334 are formed on active surface 330 prior to singulation of semiconductor die 324 from a semiconductor wafer in one embodiment. In some embodiments, a height of conductive pillars 334 and semiconductor die 324 in combination is approximately equal to a height of conductive pillars 280. With semiconductor die 324 disposed on die attach area 226, the tops of conductive pillars 280 and the tops of conductive pillars 334 are approximately the same distance from surface 214 of interposer 210. In other embodiments, solder balls similar to conductive bumps 134 are formed on conductive layer 332 rather than conductive pillars.

Semiconductor die 324 is disposed on die attach area 226 and attached to surface 214 of interposer 210 using die attach adhesive 310. In some embodiments, die attach adhesive 310 is initially disposed on back surface 328 of semiconductor die 324 rather than on die attach area 226 of interposer 210. Semiconductor die 324 and die attach adhesive 310 are then disposed over die attach area 226 together. An optional curing process is performed in embodiments where die attach adhesive 310 requires a curing process to fully adhere surface 328 of semiconductor die 324 onto die attach area 226.

In FIG. 5c, an encapsulant or molding compound 340 is deposited over and around fan-out packages 200 and semiconductor die 324. Encapsulant 340, fan-out packages 200, and semiconductor die 324 form a reconstituted wafer or panel 348. Encapsulant 340 is similar to encapsulant 240, being deposited using a paste printing, compressive molding, transfer molding, liquid encapsulant molding, vacuum lamination, spin coating, or other suitable applicator. In particular, encapsulant 340 covers the side surfaces and active surface 330 of semiconductor die 324, as well as pillars 334. Encapsulant 340 further covers side surfaces and pillars 280 of each fan-out package 200, as well as surface 214 of each interposer 210. In one embodiment, encapsulant 340 fully covers each pillar 280 and each pillar 334 such that a portion of encapsulant 340 exists over each pillar 280 and 334 opposite interposer 210. Encapsulant 340 can be polymer composite material, such as epoxy resin with filler, epoxy acrylate with filler, or polymer with proper filler. Encapsulant 340 is non-conductive and environmentally protects the semiconductor device from external elements and contaminants. Encapsulant 340 includes a flat or planar surface 342 over fan-out packages 200 and semiconductor die 324. Surface 342 is approximately parallel with surface 214 of interposer 210 and active surface 330 of semiconductor die 324.

FIG. 5d illustrates a backgrinding operation with grinder 350 or other suitable chemical or mechanical grinding or etching process to reduce a thickness of encapsulant 340 and expose conductive pillars 280 and 334. The backgrinding operation removes surface 342 of encapsulant 340 and leaves new surface 352. After backgrinding, surface 352 is substantially flat across the entire width of encapsulant 340, and approximately parallel with surface 214 of interposer 210 and active surface 330 of semiconductor die 324. Surface 352 is the combination of a top surface of encapsulant 340 and top surfaces of conductive pillars 280 and 334 exposed by operation of grinder 350. The top surface of encapsulant 340 and the top surfaces of pillars 280 and 334 are coplanar and form surface 352. Portions of encapsulant 340 over conductive pillars 280 and 334 are removed by grinder 350 to expose pillars 280 and 334. In some embodiments, portions of conductive pillars 280 and 334 are removed by grinder 350 to ensure shorter conductive pillars are exposed, and surface 352 remains substantially flat.

In some embodiments, fan-out packages 200 and semiconductor die 324 are provided on carrier 300 prior to formation of conductive pillars 280 and 334. Encapsulant 340 is formed over semiconductor die 324 and interposer 210 prior to formation of conductive pillars 280 and 334. Openings are formed in encapsulant 340 using etching or LDA where conductive pillars 280 and 334 are desired, i.e., over contact pads on active surface 330 of semiconductor die 324 and surface 214 of interposer 210. A conductive material, e.g., copper, is deposited in the openings of encapsulant 340 to form pillars 280 and 334 after encapsulant 340 is deposited.

In FIG. 5e, an insulating or passivation layer 360 is formed over encapsulant 340, conductive pillars 280, and conductive pillars 334. Insulating layer 360 contains one or more layers of SiO2, Si3N4, SiON, Ta2O5, Al2O3, or other material having similar insulating and structural properties. A portion of insulating layer 360 is removed by LDA, etching, or other suitable process to expose top surfaces of conductive pillars 280 and 334 for subsequent electrical interconnect.

An electrically conductive layer 362 is formed over insulating layer 360 using PVD, CVD, electrolytic plating, electroless plating, or other suitable metal deposition process. Conductive layer 362 contains one or more layers of Al, Cu, Sn, Ni, Au, Ag, or other suitable electrically conductive material. In one embodiment, conductive layer 362 includes an adhesion or seed layer of Ti/Cu, Titanium Tungsten (TiW)/Cu, or a coupling agent/Cu. Another metal with good wet etching selectivity, such as Ni, Au, or Ag, is optionally added to the seed layer. The seed layer is deposited by sputtering, electroless plating, or by depositing laminated Cu foil combined with electroless plating. Conductive layer 362 is electrically connected to conductive pillars 280 and conductive pillars 334 through openings in insulating layer 360.

Portions of conductive layer 362 can be electrically common or electrically isolated depending on the design and function of semiconductor die 124 and semiconductor die 324. Portions of conductive layer 362 operate as an RDL to fan-out and extend electrical connection from semiconductor die 124 and 324. In some embodiments, portions of conductive layer 362, e.g., portion 362a, couple conductive pillars 280 to conductive pillars 334 to connect semiconductor die 124 and 324. Portions of conductive layer 362 extend as conductive traces laterally, as well as perpendicular to the page, to fan-out connections from conductive pillars 280 and 334 in two dimension.

In FIG. 5f, an insulating or passivation layer 364 is formed over insulating layer 360 and conductive layer 362. Insulating layer 364 contains one or more layers of SiO2, Si3N4, SiON, Ta2O5, Al2O3, or other material having similar insulating and structural properties. Insulating layer 364 follows the contour of conductive layer 362. Accordingly, exposed portions of insulating layer 360 and conductive layer 362 are covered by insulating layer 364. Insulating layer 364 includes a surface opposite semiconductor die 124 that is substantially flat. Portions of insulating layer 364 are removed by LDA, etching, or other suitable process to expose conductive layer 362 for subsequent electrical interconnect.

An electrically conductive layer 366 is formed over insulating layer 364, fan-out package 200, and semiconductor die 324 using PVD, CVD, electrolytic plating, electroless plating, or other suitable metal deposition process. Conductive layer 366 contains one or more layers of Al, Cu, Sn, Ni, Au, Ag, or other suitable electrically conductive material. In one embodiment, conductive layer 366 includes an adhesion or seed layer of Ti/Cu, TiW/Cu, or a coupling agent/Cu. Another metal with good wet etching selectivity, such as Ni, Au, or Ag, is optionally added to the seed layer. The seed layer is deposited by sputtering, electroless plating, or by depositing laminated Cu foil combined with electroless plating.

Conductive layer 366 is electrically connected to semiconductor die 124 through conductive layer 362, conductive pillars 280, interposer 210, and conductive bumps 134. Conductive layer 366 is electrically connected to semiconductor die 324 through conductive layer 362 and conductive pillars 334. Portions of conductive layer 366 can be electrically common or electrically isolated depending on the design and function of semiconductor die 124 and semiconductor die 324. Some portions of conductive layer 366 connect multiple portions of conductive layer 362. Some portions of conductive layer 366 connect semiconductor die 124 to semiconductor die 324. Conductive layer 366 operates as an RDL to fan-out and extend electrical connection from semiconductor die 124 and 324.

Figure 5G:
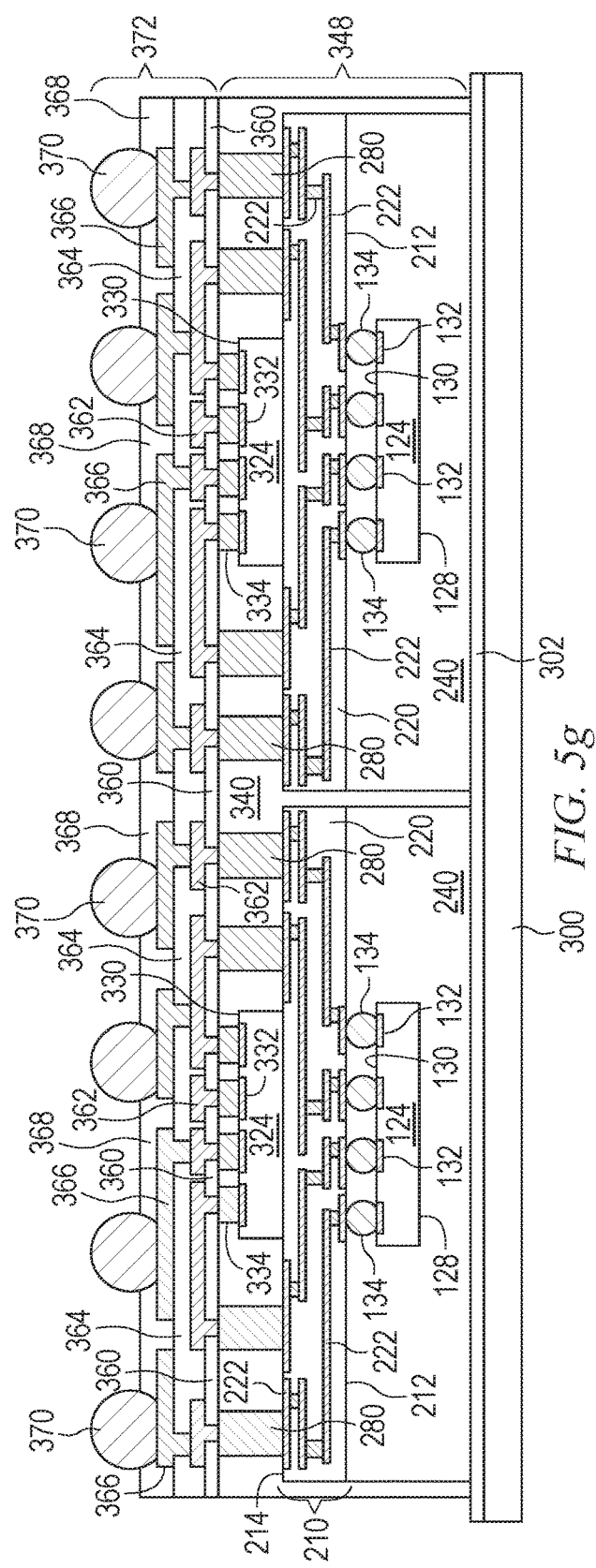

In FIG. 5g, an insulating or passivation layer 368 is formed over insulating layer 364 and conductive layer 366. Insulating layer 368 contains one or more layers of SiO2, Si3N4, SiON, Ta2O5, Al2O3, or other material having similar insulating and structural properties. Insulating layer 368 follows the contour of conductive layer 366. Accordingly, exposed portions of insulating layer 364 and conductive layer 366 are covered by insulating layer 368. Insulating layer 368 includes a surface opposite semiconductor die 124 and 324 that is substantially flat. A portion of insulating layer 368 is removed by LDA, etching, or other suitable process to expose conductive layer 366 for subsequent electrical interconnect.

An electrically conductive bump material is deposited over conductive layer 366 within openings of insulating layer 368 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 366 using a suitable attachment or bonding process. In one embodiment, the bump material is reflowed by heating the material above its melting point to form balls or bumps 370. In some applications, bumps 370 are reflowed a second time to improve electrical contact to conductive layer 366. In one embodiment, bumps 370 are formed over an under bump metallization (UBM) layer. Bumps 370 can also be compression bonded or thermocompression bonded to conductive layer 366. Bumps 370 represent one type of interconnect structure that can be formed over conductive layer 366. The interconnect structure can also use bond wires, conductive paste, stud bump, micro bump, or other electrical interconnect.

Insulating layers 360, 364, and 368, conductive layers 362 and 366, and conductive bumps 370 together constitute a build-up interconnect structure formed over semiconductor die 324, fan-out package 200, and encapsulant 340. In other embodiments, more or less conductive and insulating layers are built up over reconstituted wafer 348 to form a build-up interconnect structure.

Figure 5H:
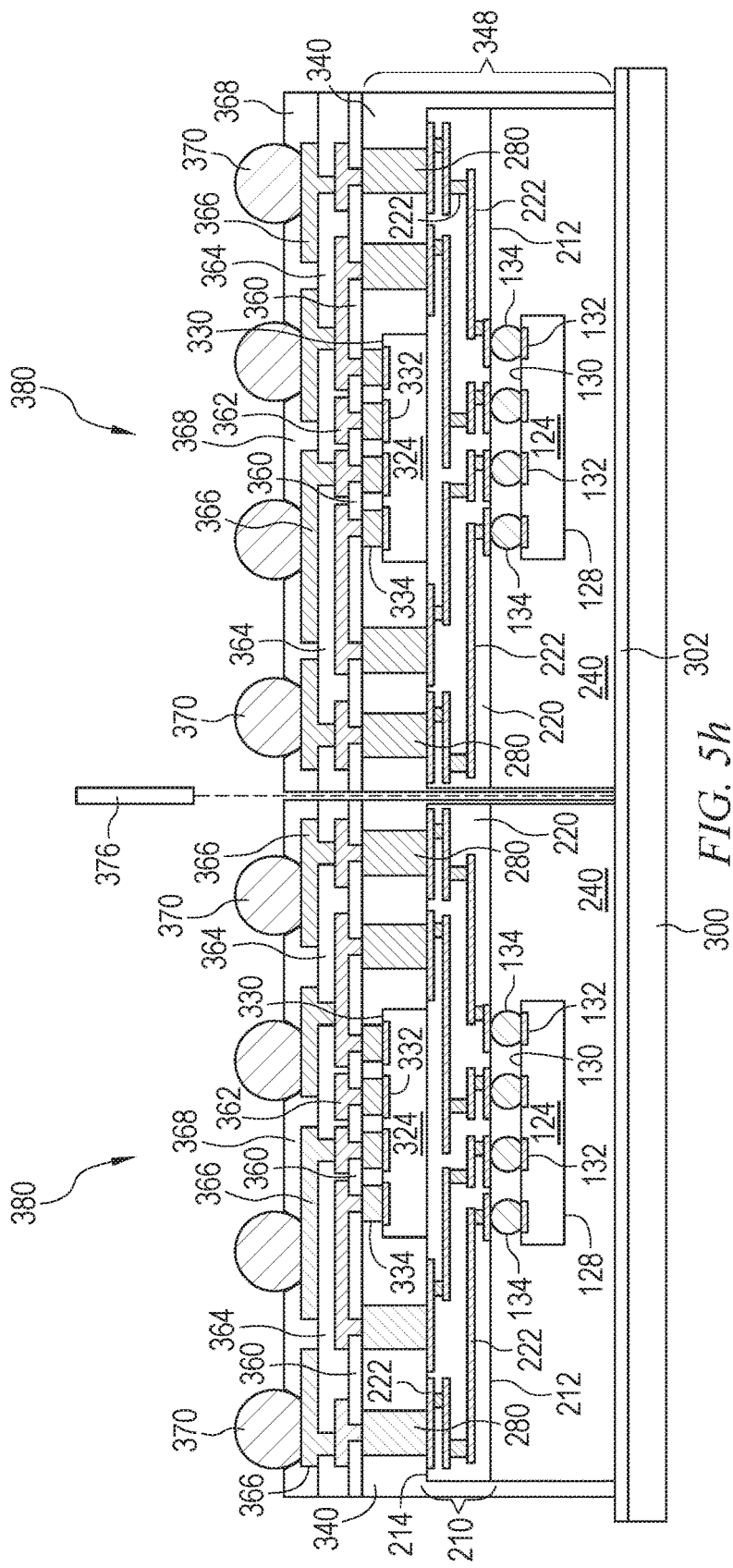

In FIG. 5h, reconstituted wafer 348 is singulated between each fan-out package 200 using a saw blade or laser cutting tool 376 into individual PI-FOP 380. PI-FOP 380 are removed from carrier 300 by mechanical peeling, thermal release, or other appropriate method. In other embodiments carrier 300 is removed from the plurality of PI-FOP 380 using chemical etching, mechanical peel-off, CMP, mechanical grinding, thermal bake, laser scanning, or wet stripping.

Figure 6A:
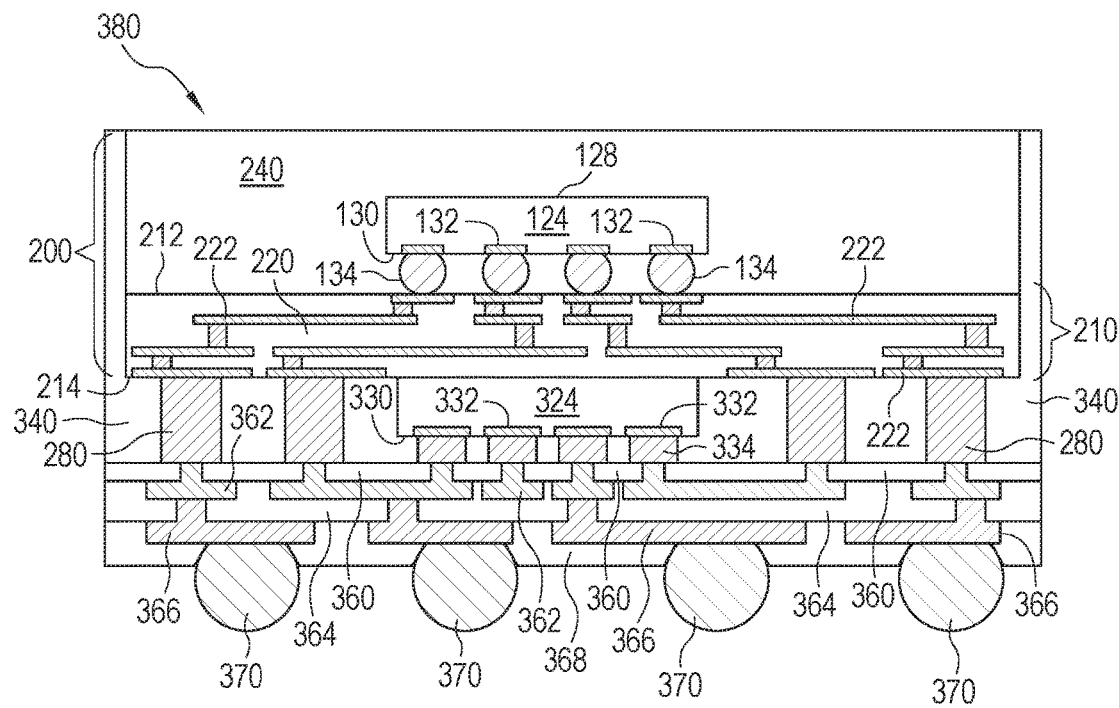
FIGS. 6a-6d illustrate completed PI-FOP devices.

FIG. 6a illustrates a completed PI-FOP 380. PI-FOP 380 includes a base fan-out package 200 with semiconductor die 124 and interposer 210. A secondary semiconductor die 324 is disposed on base fan-out package 200 between conductive pillars 280. Encapsulant 340 is deposited over base fan-out package 200 and semiconductor die 324, and pillars 280 and 334 are exposed by a backgrinding operation. Encapsulant 340 covers side surfaces of and surrounds interposer 210 and encapsulant 240 of fan-out package 200. A build-up interconnect structure formed over encapsulant 340 connects semiconductor die 124 to semiconductor die 324. The build-up interconnect structure further connects both semiconductor die 124 and 324 to conductive bumps 370 for further external interconnect, e.g., to contact pads on PCB 52. Semiconductor die 124 is externally connected through conductive layers 222 of interposer 210, conductive pillars 280, conductive layers 362 and 366, and conductive bumps 370. Semiconductor die 324 is externally connected through conductive pillars 334, conductive layer 362, conductive layer 366, and conductive bumps 370.

Semiconductor die 124 is connected to semiconductor die 324 through conductive layer 362, conductive layer 366, or both. Accordingly, PI-FOP 380 integrates the functionality of two different semiconductor die into a single package. In one embodiment, semiconductor die 124 is an application processor and semiconductor die 324 is a memory device for cell phones, tablet computers, and other mobile devices. Integrating multiple die using PI-FOP 380 is a cost-effective solution for shrinking device size. PI-FOP 380 can be catered to fine pitch applications.

Figure 6B:
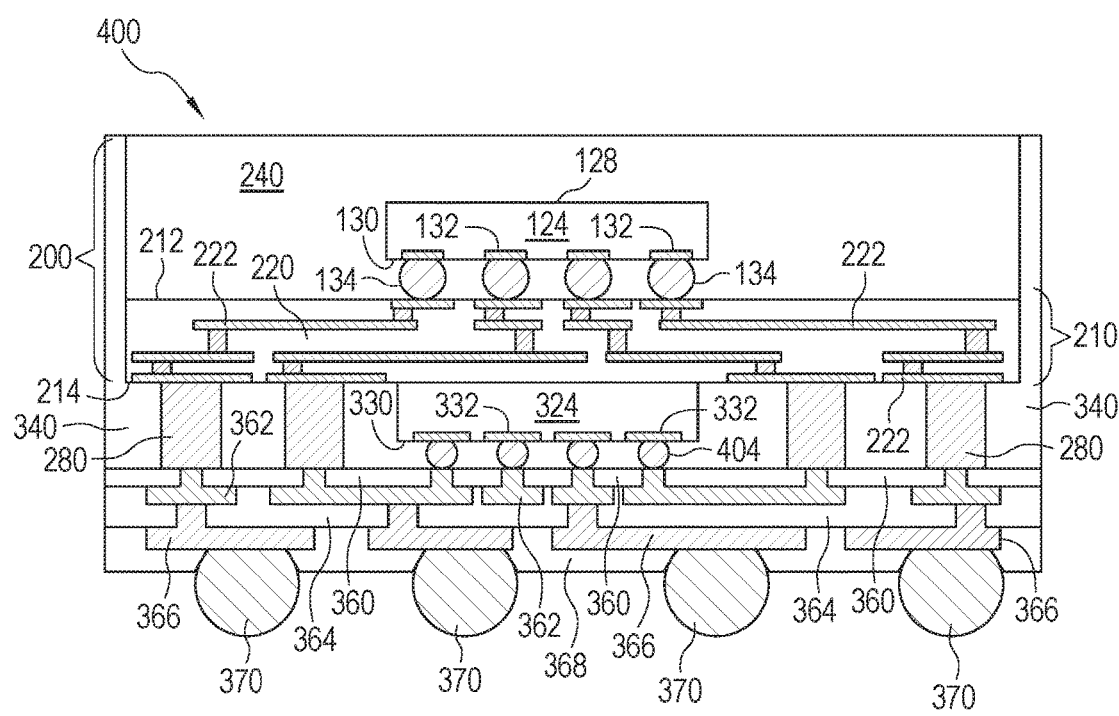

FIG. 6b illustrates PI-FOP 400. PI-FOP 400 is similar to PI-FOP 380, but semiconductor die 324 is provided with conductive bumps 404, e.g., solder balls, rather than conductive pillars 334. Bumps 404 are formed prior to singulation of semiconductor die 324, while a plurality of semiconductor die 324 are in wafer form, similar to semiconductor wafer 120 in FIG. 2a. In other embodiments, bumps 404 are formed after semiconductor die 324 is disposed on fan-out package 200 and carrier 300. Bumps 404 are used along with bumps 292 of fan-out package 290, build-up interconnect structure 296 of fan-out package 294, and other fan-out packages in some embodiments.

Figure 6C:
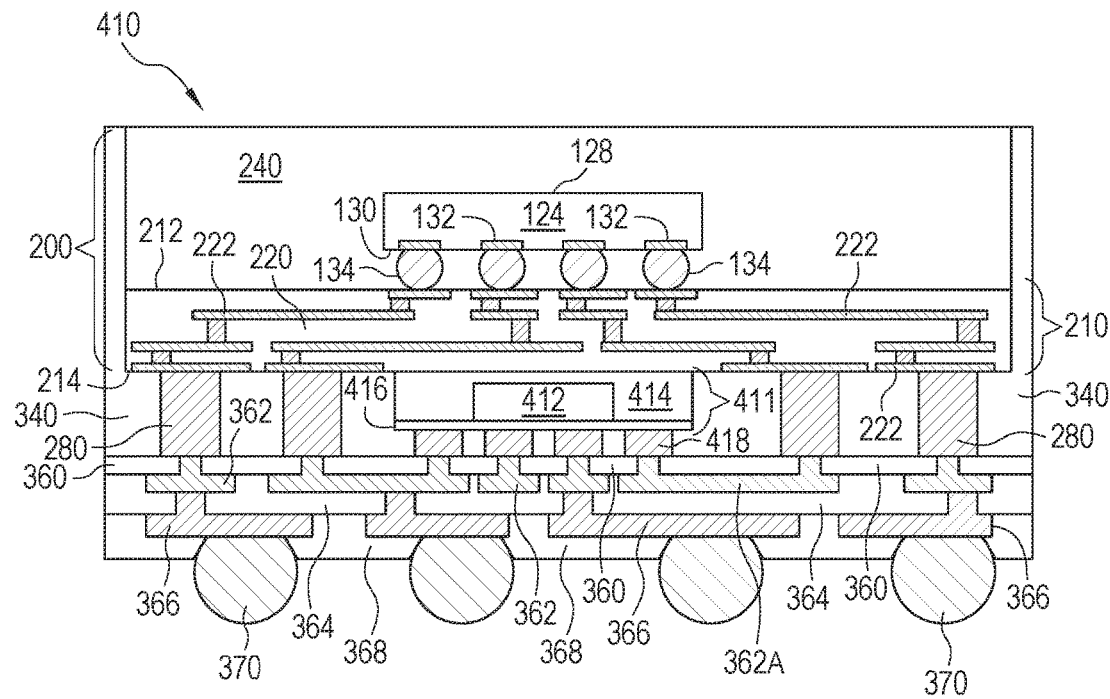

FIG. 6c illustrates PI-FOP 410. PI-FOP 410 utilizes semiconductor package 411 in place of bare semiconductor die 324. Semiconductor package 411 includes a semiconductor die 412, which is similar to semiconductor die 324. Semiconductor die 412 is surrounded by encapsulant 414. A fan-out or fan-in interconnect structure 416 is disposed over encapsulant 414 and semiconductor die 412. Interconnect structure 416 electrically couples semiconductor die 412 to conductive pillars 418. In other embodiments, conductive bumps 404 are used instead of conductive pillars 418. Interconnect structure 416 is a prefabricated interposer similar to interposer 210. In other embodiments, interconnect structure 416 is a build-up interconnect structure formed over semiconductor die 412 after encapsulation, similar to build-up interconnect structure 296.

Semiconductor package 411 is disposed over interposer 210 within die attach area 226. Encapsulant 340 is deposited over semiconductor package 411 and fan-out package 200. Conductive layers 362 and 366 connect semiconductor die 124 to semiconductor die 412 and conductive bumps 370. Semiconductor package 411 may replace semiconductor die 324 on any of the disclosed fan-out package embodiments.

Figure 6D:
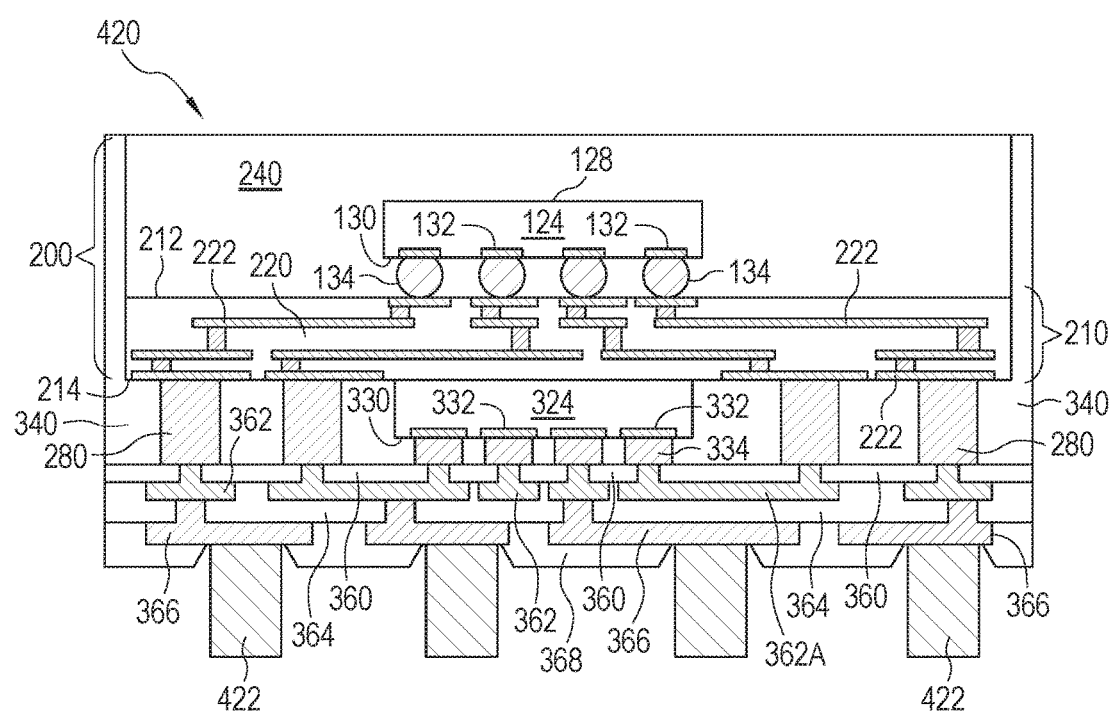

FIG. 6d illustrates PI-FOP 420. PI-FOP 420 uses conductive pillars 422 instead of conductive bumps 370. Conductive pillars 422 are similar to conductive pillars 280 and 334. Conductive pillars 422 are formed using a patterned insulating layer and photoresist in one embodiment. Conductive pillars 422 provide interconnection from semiconductor die 124 and 324 to external systems, e.g., other components disposed on PCB 52. Conductive pillars 422 are able to replace conductive bumps 370 in any of the disclosed embodiments.

Figure 7A:
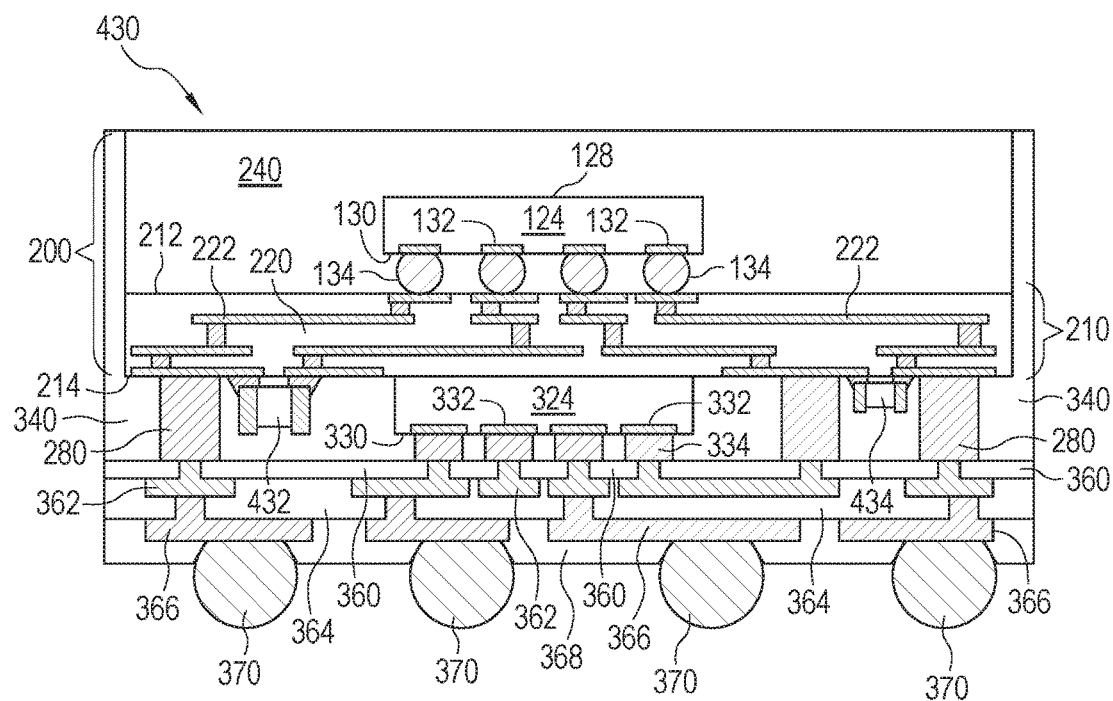
FIGS. 7a-7b illustrate PI-FOP devices with embedded discrete components.

FIG. 7a illustrates PI-FOP 430 with additional discrete components 432 and 434. Discrete components 432 and 434 are any electrical component with functionality desirable for use in conjunction with semiconductor die 124 and 324. In one embodiment, discrete components 432 and 434 are passive components such as capacitors, inductors, and resistors. Other discrete components are provided in other embodiments.

Discrete components 432 and 434 are disposed on surface 214 of interposer 210. Contacts of discrete components 432 and 434 are disposed over contact pads of conductive layer 222 on surface 214. Discrete components are connected to conductive layer 222 by a solder or similar connection. In other embodiments, bond wires or other additional interconnect structures are provided to couple discrete components 432 and 434 to conductive layers 222. Discrete components 432 and 434 are disposed on interposer 210 during formation of fan-out packages 200, prior to the singulation step disclosed in FIG. 3e. In some embodiments, discrete components 432 and 434 are disposed on either of surfaces 212 or 214 during the initial formation of interposer 210, before mounting semiconductor die 124 as illustrated in FIG. 3a. In other embodiments, discrete components 432 and 434 are disposed on surface 214 along with semiconductor die 324 during formation of PI-FOP 430.

Figure 7B:
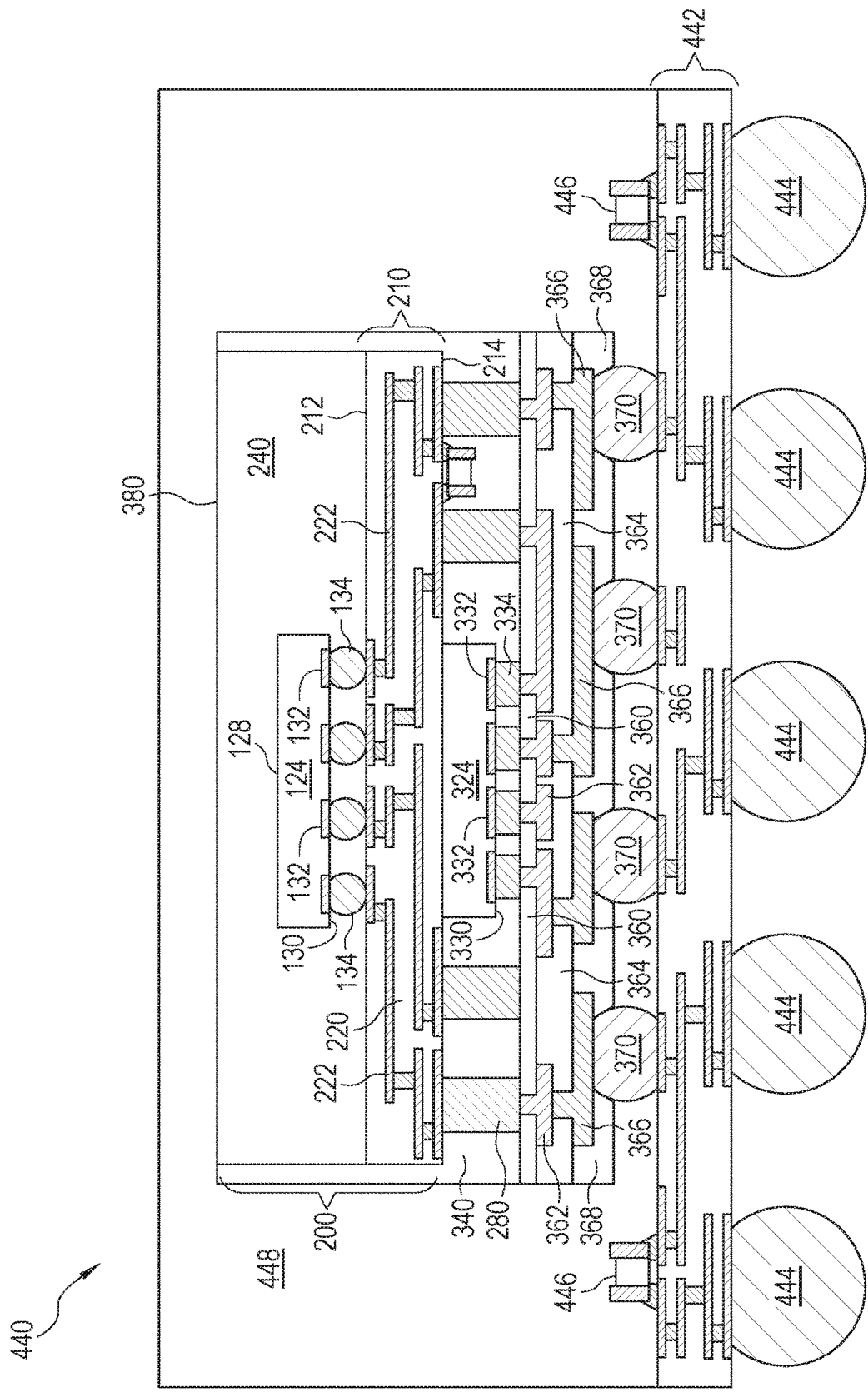

FIG. 7b illustrates PI-FOP 440. PI-FOP 440 includes PI-FOP 380, or another PI-FOP embodiment, disposed over interposer 442. Interposer 442 includes conductive bumps 444, conductive pillars, or another interconnect structure disposed over the interposer opposite PI-FOP 380 for subsequent external interconnect, e.g., to PCB 52. PI-FOP 380 is disposed on and electrically connected to interposer 442. Discrete components 446 are disposed on interposer 442 adjacent to PI-FOP 380 and connected to contact pads of interposer 442 by a solder connection, wire bonds, or another appropriate interconnect structure. Discrete components 446 are similar to discrete components 432 and 434, and may be capacitors, inductors, resistors, or other discrete electrical components. Encapsulant 448 is deposited over PI-FOP 380 and discrete components 446. PI-FOP 440 is singulated through encapsulant 448 and interposer 442 as necessary, i.e., in embodiments where interposer 442 is provided as a panel and multiple PI-FOP 380 are disposed over the interposer and encapsulated together.

Discrete components 446 are coupled through interposer 442 to PI-FOP 380, and further to semiconductor die 124 and 324 through the conductive layers, pillars, and bumps of PI-FOP 380. Conductive bumps 444 provide external interconnect for semiconductor die 124 and 324 of PI-FOP 380. Discrete components 446 are wired in parallel or series between contact pads of semiconductor die 124 and 324, and conductive bumps 444, to integrate the functionality of discrete components 446 with the functionality of PI-FOP 380. PI-FOP 440 is mounted and electrically connected to PCB 52 or another substrate by reflowing bumps 444 onto contact pads of the substrate.

Figure 8A:
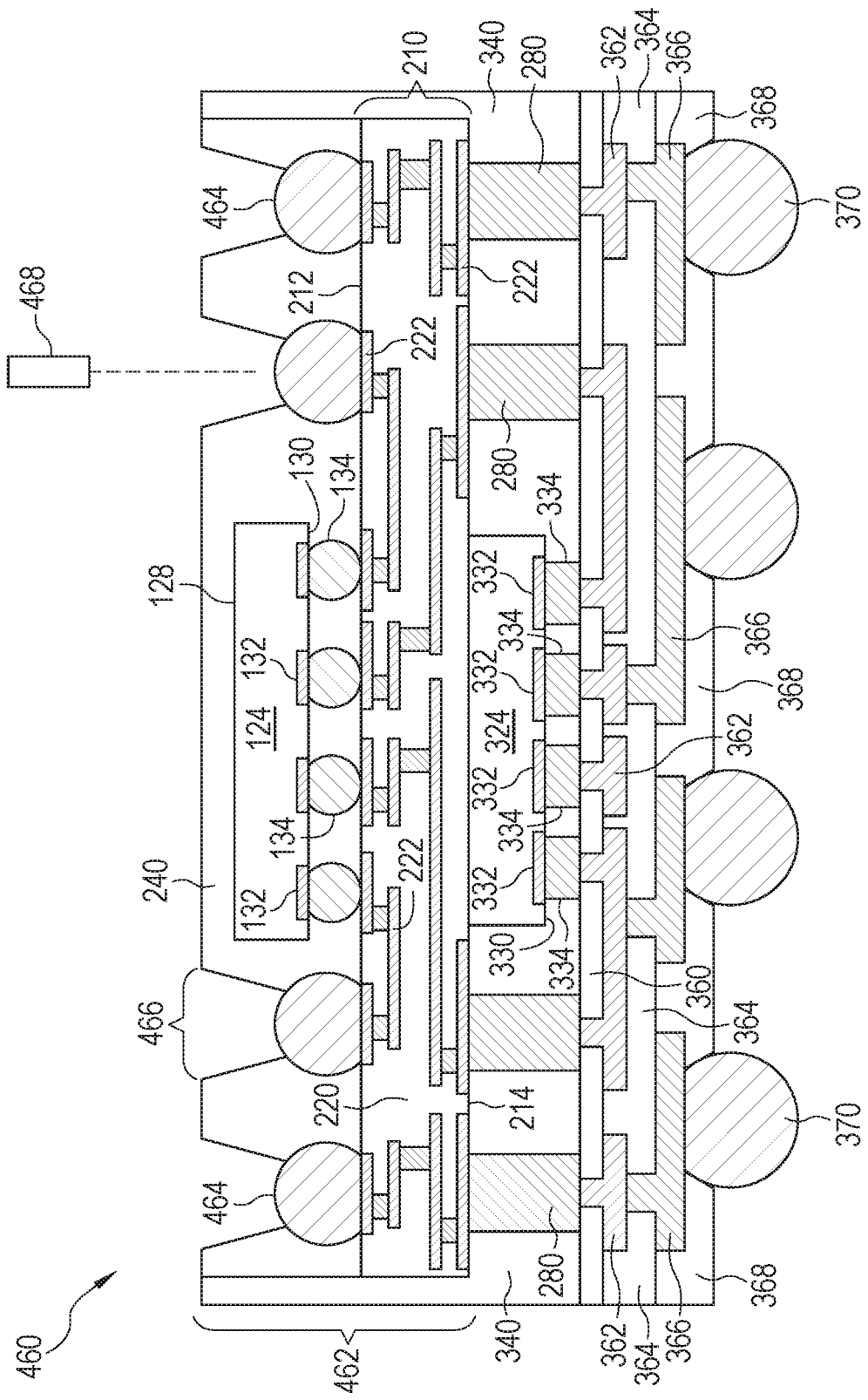
FIGS. 8a-8b illustrate a PI-FOP package-on-package device with a molded laser fan-out package.

In FIG. 8a, a PI-FOP 460 including molded laser package 462 is illustrated. Molded laser package 462 is similar to fan-out package 200, and forms the base of PI-FOP 460. Molded laser package 462 includes conductive bumps 464 disposed on and bonded to contact pads of interposer 210 adjacent to semiconductor die 124. Encapsulant 240 is disposed over semiconductor die 124 and interposer 210 as with other fan-out package embodiments. However, encapsulant 240 also surrounds and encapsulates conductive bumps 464. In other embodiments, conductive pillars or another appropriate interconnect structure is used instead of conductive bumps 464.

Openings 466 are formed through encapsulant 240 by LDA using laser 468 to expose conductive bumps 464 for subsequent interconnection to an additional semiconductor package. In other embodiments, openings 466 are formed by another appropriate etching technique. Openings 466 extend from the top surface of encapsulant 240 to conductive bumps 464.

Figure 8B:
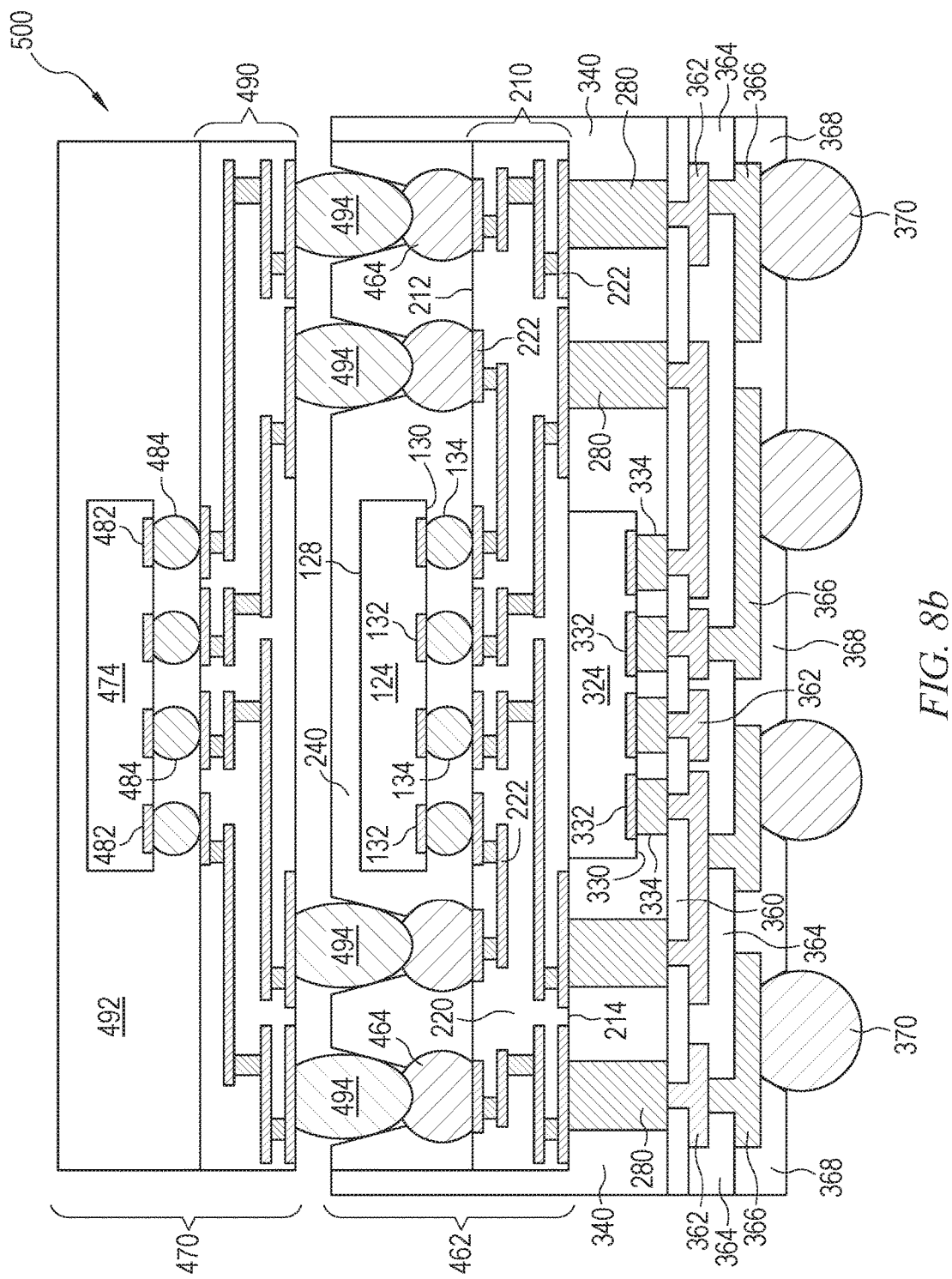

In FIG. 8b, a fan-out package 470 is disposed over molded laser package 462. Fan-out package 470 is similar to fan-out package 200. Fan-out package 470 includes semiconductor die 474 to provide active functionality. Contact pads 482 of semiconductor die 474 are connected through conductive bumps 484 to interposer 490. Encapsulant 492 is deposited over semiconductor die 474 and interposer 490. Conductive bumps 494 are disposed over interposer 490 opposite semiconductor die 474. Conductive bumps 494 are positioned to align with openings 466 when fan-out package 470 is disposed over molded laser package 462. Fan-out package 470 is moved toward molded leaded package 462 to insert conductive bumps 494 into openings 466. A reflow process is performed to melt conductive bumps 464 and conductive bumps 494 and create a single interconnect structure extending through encapsulant 240 from interposer 490 to interposer 210. Fan-out package 470 mounted to a top surface of PI-FOP 460 creates a PI-FOP package-on-package device 500.

Semiconductor die 474 is coupled to conductive bumps 370 through conductive layers in interposer 490, conductive bumps 494 and 464, conductive layers 222 of interposer 210, conductive pillars 280, conductive layer 362, and conductive layer 366. Package-on-package PI-FOP 500 is mounted to and electrically connected to PCB 52 or another substrate using conductive bumps 370. Conductive bumps 370 provide electrical interconnection from PCB 52 to semiconductor die 324, semiconductor die 124, and semiconductor die 474. Forming package-on-package PI-FOP 500 using molded laser package 462 is compatible with any of the above PI-FOP embodiments. Discrete components may be disposed on either surface of interposer 210 or interposer 490. Thin interposers 210 and 490 are used, which, along with a low package height for molded laser package 462 and fan-out package 470, allow a stacking of packages 462 and 470 in a package-on-package configuration.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
   providing a first semiconductor package including a first interconnect structure extending over a surface of the first semiconductor package;
   disposing a first semiconductor die over the surface of the first semiconductor package within a height of the first interconnect structure and including a second interconnect structure extending over the first semiconductor die opposite the first semiconductor package;
   depositing a first encapsulant over the first semiconductor package and first semiconductor die; and
   planarizing the first encapsulant to expose the first interconnect structure and second interconnect structure.

2. The method of claim 1, further including disposing a discrete component on the surface of the first semiconductor package.

3. The method of claim 1, wherein providing the first semiconductor package includes:
   providing an interposer;
   disposing a second semiconductor die over the interposer;
   depositing a second encapsulant over the interposer and second semiconductor die; and
   disposing the first interconnect structure over the interposer opposite the second semiconductor die.

4. The method of claim 3, further including:
   disposing a solder bump over the interposer; and
   removing a portion of the second encapsulant by laser direct ablation (LDA) to expose the solder bump.

5. The method of claim 1, further including forming a build-up interconnect structure over the first semiconductor package and first semiconductor die, wherein a conductive layer of the build-up interconnect structure physically contacts the first interconnect structure and second interconnect structure.

6. The method of claim 1, further including:
   providing a second semiconductor package including the first semiconductor die; and
   disposing the second semiconductor package over the surface of the first semiconductor package.

7. A method of making a semiconductor device, comprising:
   providing a first semiconductor package including a first interconnect structure;
   providing a first semiconductor die including a second interconnect structure extending over an active surface of the first semiconductor die;
   disposing the first semiconductor die over the first semiconductor package with the active surface of the first semiconductor die oriented away from the first semiconductor package;
   depositing a first encapsulant over the first semiconductor package and first semiconductor die; and
   forming a third interconnect structure over the first semiconductor package, first semiconductor die, and first encapsulant.

8. The method of claim 7, further including disposing a second semiconductor package over the first semiconductor package opposite the first semiconductor die.

9. The method of claim 7, wherein the first interconnect structure includes a conductive bump or conductive pillar.

10. The method of claim 7, wherein the second interconnect structure includes a conductive bump or conductive pillar.

11. The method of claim 7, further including forming a build-up interconnect structure over the first semiconductor package and first semiconductor die.

12. The method of claim 7, further including disposing a discrete component over the first semiconductor package adjacent to the first semiconductor die.

13. The method of claim 7, wherein providing the first semiconductor package further includes:
    providing an interposer;
    disposing a second semiconductor die over the interposer; and
    depositing a second encapsulant over the second semiconductor die and the interposer.

14. A method of making a semiconductor device, comprising:
    providing a first semiconductor package including a first interconnect structure disposed over a surface of the first semiconductor package; and
    disposing a first semiconductor die over the surface of the first semiconductor package including a second interconnect structure of the first semiconductor die oriented away from the first semiconductor package.

15. The method of claim 14, further including disposing a discrete component over the surface of the first semiconductor package.

16. The method of claim 14, further including providing the first semiconductor package to include an interposer.

17. The method of claim 14, further including disposing a second semiconductor package over the first semiconductor package opposite the first semiconductor die.

18. The method of claim 17, further including providing the first semiconductor package as a molded laser package.

19. The method of claim 14, further including forming a fan-out interconnect structure over the first semiconductor package and first semiconductor die.

20. A method of making a semiconductor device, comprising:
    providing a first semiconductor package;
    disposing a first semiconductor die over the first semiconductor package with an active surface of the first semiconductor die oriented away from the first semiconductor package; and
    forming an interconnect structure over the first semiconductor package and first semiconductor die to electrically couple the first semiconductor package to the first semiconductor die.

21. The method of claim 20, further including depositing an encapsulant over the first semiconductor package and first semiconductor die.

22. The method of claim 21, further including:
disposing a first conductive pillar on the first semiconductor package; and
removing a portion of the encapsulant over the first conductive pillar.

23. The method of claim 22, further including:
disposing a second conductive pillar on the first semiconductor die; and
removing a portion of the encapsulant over the second conductive pillar.

24. The method of claim 20, further including disposing a molded laser package over the interconnect structure.

25. The method of claim 20, further including disposing a discrete component over the first semiconductor package.

* * * * *